(12) United States Patent
Subramanian et al.

(10) Patent No.: US 6,562,248 B1
(45) Date of Patent: May 13, 2003

(54) ACTIVE CONTROL OF PHASE SHIFT MASK ETCHING PROCESS

(75) Inventors: Ramkumar Subramanian, San Jose, CA (US); Bhanwar Singh, Morgan Hill, CA (US); Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 108 days.

(21) Appl. No.: 09/817,518

(22) Filed: Mar. 26, 2001

(51) Int. Cl.[7] .......................... G01N 21/00; G01B 11/00
(52) U.S. Cl. ..................................... 216/12; 156/345.24
(58) Field of Search ....................... 156/345.24, 345.25, 156/345.28; 430/5; 216/12

(56) References Cited

U.S. PATENT DOCUMENTS

| | | | |
|---|---|---|---|
| 4,927,485 A | * 5/1990 | Cheng et al. | 156/345.25 |
| 4,927,785 A | * 5/1990 | Theeten et al. | 438/712 |
| 5,807,649 A | 9/1998 | Liebmann et al. | 430/5 |
| 6,129,807 A | * 10/2000 | Grimbergen et al. | 118/712 |
| 6,174,407 B1 | * 1/2001 | Johnson et al. | 118/723 E |

OTHER PUBLICATIONS

*Masks: What's Behind Rising Costs? Semiconductor International.* http://209.67.253.149/semiconductor/issues/issues/1999/sep99/docs/features5.asp, Last Viewed Oct. 10, 2000. pp. 1–7.

\* cited by examiner

*Primary Examiner*—Thi Dang
(74) *Attorney, Agent, or Firm*—Amin & Turocy, LLP

(57) ABSTRACT

A system for monitoring and controlling aperture etching in a complimentary phase shift mask is provided. The system includes one or more light sources, each light source directing light to one or more apertures etched on a mask. Light reflected from the apertures is collected by a measuring system, which processes the collected light. Light passing through the apertures may similarly be collected by the measuring system, which processes the collected light. The collected light is indicative of the depth and/or width of the openings on the mask. The measuring system provides depth and/or width related data to a processor that determines the acceptability of the aperture depth and/or width. The system also includes a plurality of etching devices associated with etching apertures in the mask. The processor selectively controls the etching devices so as to regulate aperture etching.

8 Claims, 20 Drawing Sheets

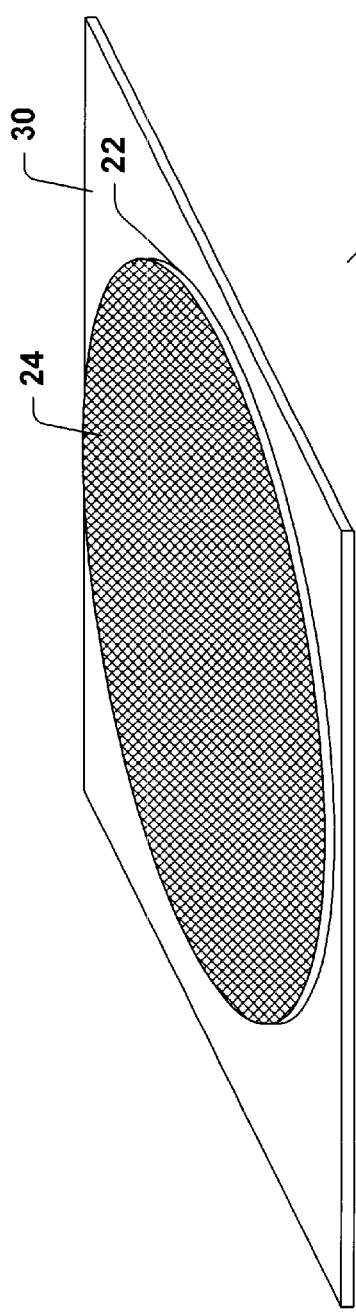
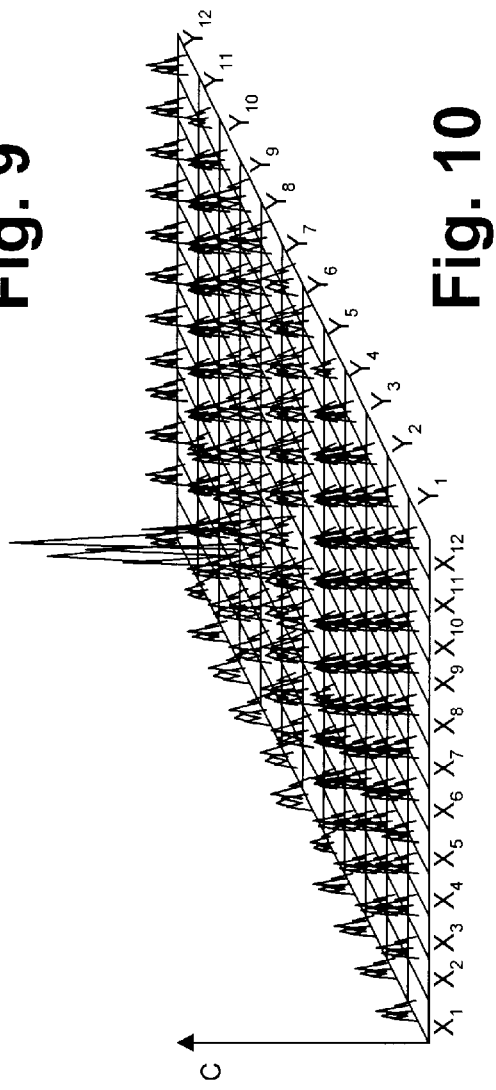
Fig. 9
Fig. 10
Fig. 11

SURFACE NORMAL    SPECULARLY REFLECTED BEAM

Prior Art Fig. 15

ACTIVE CONTROL OF PHASE SHIFT MASK ETCHING PROCESS

TECHNICAL FIELD

The present invention generally relates to semiconductor processing, and in particular to a system for monitoring and controlling the etching of openings in a phase shift mask.

BACKGROUND

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller features sizes and more precise feature shapes are required. This may include the width and spacing of interconnecting lines, spacing and diameter of contact holes, and the surface geometry, such as corners and edges, of various features. When feature sizes become so small that they approach the wavelength of the exposure light used in semiconductor manufacturing, complex exposure techniques including complimentary phase shift masking may be employed. In complimentary phase shift masking, light passing through one or more masks may be phase shifted to facilitate selective interference and cancellation of light waves. The ability to control the phase shift of the light passing through a mask is important to achieving the desired critical dimensions on the chip.

The masks employed in semiconductor fabrication that utilize complimentary phase shift masking may include a quartz layer coated with a chrome layer. The quartz layer allows light waves to pass through, while the chrome layer prevents light waves from passing through the mask. Thus, either a positive or negative of the pattern to be projected onto a chip being fabricated is processed into the chrome layer on a complimentary phase shift mask. The depth and/or width of the openings (apertures) in the complimentary phase shift mask enable light passing through the apertures to be phase shifted.

The process of manufacturing masks may consist of hundreds of steps. One such step is depositing a chrome layer on a clean quartz layer (substrate). Once deposited, openings (apertures) are etched into the chrome layer. Controlling the width and depth of the openings etched into the chrome layer and controlling the width and depth of trenches carved into the substrate is required to enable controlled phase shifting of light that will pass through the mask. Conventional mask fabrication methods may not provide fine enough control of the aperture etching process and thus desired phase shifting may not be achieved. Thus, a system and method for controlling the aperture etching process is required.

The process of manufacturing semiconductors, (integrated circuits, ICs, chips), employing complimentary phase shift masks typically consists of more than a hundred steps, during which hundreds of copies of an integrated circuit may be formed on a single wafer. Generally, the process involves creating several patterned layers on and into the substrate that ultimately forms the complete integrated circuit. The patterned layers are created, in part, by the light that passes through complimentary phase shift masks. Thus, processing the positive or negative of the pattern into the mask is important in fabricating the chips.

The requirement of small features with close spacing between adjacent features requires sophisticated manufacturing techniques, including high-resolution photolithographic processes such as complimentary phase shift masking. Fabricating a semiconductor using such sophisticated techniques may involve a series of steps including exposing the photo resist one or more times to one or more light sources (where the phase of the light may be shifted). In conventional lithography, an exposure is performed using a single mask where the photo resist is exposed by a single radiation source. The resolution, which is typically defined as the smallest distance two features can be spaced apart while removing all photo resist between the features, is equal to:

$$D = k1 * (\text{lambda}/NA)$$

where d is the resolution, lambda is the wavelength of the exposing radiation, NA is the numerical aperture of the lens, and k1 is a process dependent constant typically having a value of approximately 0.7. While resolution may be improved by decreasing the wavelength or by using a lens with a larger NA, decreasing the wavelength and increasing the numerical aperture decreases the depth of focus (since depth of focus is proportional to lambda/NA), which creates additional problems. Thus, several techniques have been developed to enhance the resolution of conventional lithography to enable formation of patterned resist layers with smaller dimensions than those achievable with conventional methods. For example, phase-shifted masks (PSM) have been developed. In a PSM mask, features are surrounded by light transmitting regions that shift the phase of the transmitted light compared to the feature. Masks may be constructed to shift the phase of the light varying amounts, including, but not limited to, 30 degrees, 60 degrees, 90 degrees, and 180 degrees. In this way, the diffraction fringes at the edges of the features can be effectively cancelled, resulting in a better image contrast.

The resolution of both conventional and enhanced resolution lithographic processes is better for periodic features, such as those found in memory devices (e.g. DRAMs) because a greater percentage of the exposing radiation is contained in the diffraction nodes of the periodic structures compared to that contained in the diffraction nodes of isolated features. For example, prior art FIG. 15 illustrates an aerial plot of intensity under a mask 800 having an isolated feature 802 and periodic features 810, 812, and 814 having a dimension near the resolution limit of the process. The contrast (difference in intensity) between masked and unmasked regions is much greater for the periodic features 810, 812 and 814 (curve 806) than for the isolated feature 802 (curve 808). Thus, for a given combination of exposing conditions, at some dimension, isolated feature 802 cannot be resolved simultaneously with the periodic features 810, 812 and 814 that are within the resolution limit of the process.

To alleviate the problems associated with isolated features in complimentary phase shift masking, complementary features are added around the isolated device features on a first mask to produce a periodic structure that allows for improved resolution of the lithographic process. The effects created by the complementary features may require the light passing through the features to have its phase shifted. Such a shift may be accomplished by varying the width and/or the depth of the opening through which the light passes.

In a positive photo resist method, the complementary features are then obliterated by exposure to light passing through a second mask prior to forming the patterned resist layer. The second mask also provides for improved contrast that enables more precise feature shapes. To take advantage of complimentary phase shift masking, and removal of unwanted complimentary structures, precise control of the depth and/or width of the openings in the complimentary phase shift masks is required. If the depth and/or width of the opening is not precisely controlled, then the phase shifting, diffraction and cancellation processes employed in complimentary phase shift masking will not lead to a desired cancellation of light and the isolated features will not benefit from the improved contrast and resulting improved quality.

The complimentary phase shift masking discussed above is possible because light passing through one or more apertures (apertures) on a mask employed in chip manufacturing is diffracted. Diffraction is a property of wave motion, in which waves spread and bend when passed through small apertures or around barriers. A mask may have many such apertures and barriers. The bending and/or spreading of the light waves is more pronounced when the size of the aperture or the barrier approximates or is smaller than the wavelength of the incoming wave. With feature sizes approaching and becoming smaller than the wavelength of the exposing light, the apertures and/or barriers on the mask have thus become closer to the wavelength of the exposing light. Thus diffraction in chip manufacturing has become more pronounced, which can lead, for example, to rounded features and features that do not have a desired size and/or shape. For example, in prior art FIG. 16, a light source is directing light waves 1620 at a mask 1622. Some of the light waves 1620 pass through an aperture 1626 that is close to the size of the wavelength of the light waves 1620. The mask 1622 has been designed to develop a region 1638 on a photo resist layer 1624, so that two desired features 1642 and 1644 can be formed. The features 1642 and 1644 are desired to be rectangular, with substantially square edges. The aperture 1626 is small because the desired features 1642 and 1644 are correspondingly small.

With conventional lithography, the light waves 1620 may pass directly through the aperture 1626, exposing the region 1638, but the light waves 1620 may also be diffracted as illustrated by light waves 1628, 1630 and 1632. The diffracted wave 1628 has exposed a region 1634 and the diffracted wave 1630 has exposed a region 1636. Neither region 1634 nor region 1636 were intended to be exposed. Further, diffracted wave 1632 has exposed a triangular area 1640. Thus the desired feature 1644 may not have a substantially square edge due to the undesired region 1640 being exposed by the diffracted wave 1632. Complimentary phase shift masking mitigates the diffraction problems described above by accounting for and counter-acting the diffraction effects noted above.

A theory explaining diffraction is that each point of a wave on a flat wave front may be a source of secondary, spherical wavelets. Before reaching a barrier or aperture, the secondary wavelets may add to the original wave front. When the wave front approaches an aperture or barrier, the wavelets approaching the unobstructed region pass through the barrier, while other wavelets do not pass. When the size of the aperture approaches the wavelength of or is smaller than the wavelength of the incoming wave, only a few wavelets may pass through the aperture. The wavelets that pass through the aperture or around the barrier may then be a source of more wavelets that expand in all directions from the point of the obstruction, and the shape of the new wave front is curved. The wavelets of these diffracted, or bent, waves can now travel different paths and subsequently interfere with each other, producing interference patterns. The shape of these patterns depends on the wavelength and the size of the aperture or barrier. Diffraction can be thought of as the interference of a large number of coherent wave sources, and thus, diffraction and interference are substantially similar phenomenon.

To achieve desired interference, which leads to cancellation of undesired light waves, complimentary phase shift masks, which are well known in the art, are employed in manufacturing chips. Similarly, to enable smaller isolated feature sizes, complimentary phase shift masks are employed in manufacturing chips. Precise control of the depth and/or width of the openings in a mask employed in complimentary phase shift masking is required to enable the control of the phase shifting and resulting cancellation and interference that enables the smaller feature sizes with improved feature shapes. Thus, an efficient system and/or method to monitor and control the fabrication of the openings in complimentary phase shift masks is desired to increase fidelity in image transfer.

SUMMARY

The following presents a simplified summary of the invention in order to provide a basic understanding of some aspects of the invention. This summary is not an extensive overview of the invention. It is not intended to identify key or critical elements of the invention or to delineate the scope of the invention. Its sole purpose is to present some concepts of the invention in a simplified form as a prelude to the more detailed description presented later.

The present invention provides a system that facilitates monitoring and controlling the fabrication of openings (apertures) in complimentary phase shift masks employed in semiconductor manufacturing. Controlling the mask fabrication process with runtime feedback provides superior mask fabrication as compared to conventional systems and thus facilitates achieving smaller feature sizes with improved shapes via more precise control of phase shifting of light passing through the complimentary phase shift mask. An exemplary system may employ one or more light sources arranged to project light onto one or more apertures on a mask being fabricated and one or more light sensing devices (e.g., photo detector, photodiode) for detecting light reflected by the one or more apertures. The light reflected from the one or more apertures is indicative of at least one parameter of the mask fabrication process (e.g., depth of opening, width of opening). The depth and/or width of the apertures are important to the fidelity of the image transfer process due to effects on phase shifting and diffraction, and thus monitoring the depth and/or width of the apertures in the masks enables fabricating higher quality complimentary phase shift masks as compared to conventional systems.

A diffraction grating is an optical device that is used to determine the different wavelengths or colors contained in a beam of light. The apertures in a complimentary phase shift mask may operate, at least in part, similarly to a diffraction grating in that light will be reflected and dispersed when directed onto an aperture. A diffraction grating may include a reflecting surface, on which numerous narrow parallel grooves have been etched close together. A mask may contain numerous apertures etched closely together, which similarly will reflect and diffract light. A beam of light directed at such a surface is scattered, or diffracted, in all directions at each such aperture. Such scattering will be affected by the depth and the width of the apertures etched in the mask. The light waves reinforce each other in certain directions and cancel out in other directions, creating unique signatures for different wavelengths and/or angles of incidence of the light directed onto the mask.

One or more etching components may be employed in fabricating a particular mask. It is to be appreciated by one skilled in the art that any suitable etching components may be employed with the present invention. The etching components are selectively driven by the system to etch the openings in the mask to a desired depth, shape and/or width. The etching process is monitored by the system by comparing signatures generated by the light reflected by the mask to desired signatures. By comparing desired signatures to measured signatures, runtime feedback may be employed to more precisely control the aperture etching and as a result more optimal aperture etching is achieved, which in turn increases fidelity of image transfer, because more precise phase shifting and the resulting interference and cancellation may be enabled.

In accordance with an aspect of the present invention, a system for monitoring and controlling aperture etching in a complimentary phase shift mask is provided. The system includes etching components operative to etch apertures in the mask and an etching component driving system for driving the one or more etching components. The system also includes components for directing light on to the apertures being etched in the mask and a measuring system for measuring aperture parameters based on light reflected from the apertures. The measuring system includes a scatterometry system for processing the light reflected from the one or more apertures and a processor operatively coupled to the measuring system and the etching component driving system. The processor receives aperture data from the measuring system and uses the data to at least partially control the etching components to regulate the etching of the one or more apertures.

Another aspect of the present invention provides a method for monitoring and controlling aperture etching in a complimentary phase shift mask. The method includes etching apertures on the mask and while such apertures are being etched, directing light onto at least one of the apertures and collecting light reflected from the apertures. The reflected light is analyzed to determine parameters like the depth and/or width of the aperture via scatterometry means. In response to the analysis of the reflected light, the etching performed by the etching component is controlled to improve the etching of the apertures in the mask.

Still another aspect of the present invention provides a method for monitoring and controlling aperture etching in a complimentary phase shift mask. The method includes using etching components to etch apertures in the mask, determining the acceptability of the apertures etched in the mask and using coordinating control of the etching components to more optimally etch the apertures in the mask.

Yet another aspect of the present invention provides a system for monitoring and controlling a process for etching openings in a complimentary phase shift mask. The system includes means for sensing the depth and/or width of apertures on the mask, means for etching apertures on the mask and means for selectively controlling the means for etching.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The present invention is illustrated by way of example in the accompanying figures.

FIG. 9 is a perspective illustration of a mask that may be fabricated in accordance with an aspect of the present invention.

FIG. 10 is a representative three-dimensional grid map of a mask illustrating opening signature measurements taken at grid blocks of the mask in accordance with an aspect of the present invention.

FIG. 11 is a mask opening signature measurement table correlating the mask opening measurements of FIG. 10 with desired values for the mask opening measurements in accordance with the present invention.

Prior Art

Prior Art

DETAILED DESCRIPTION

Figure 1:
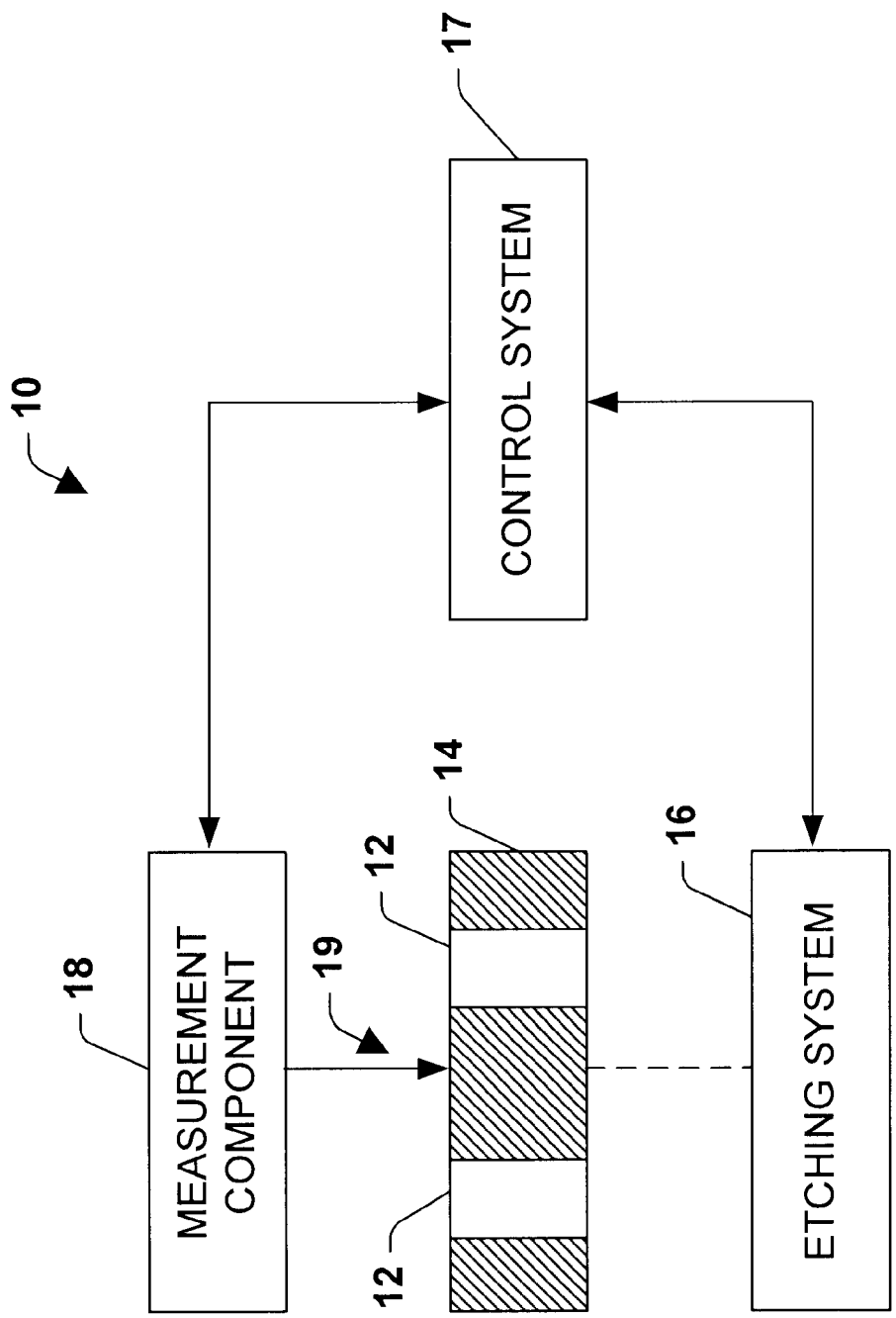
FIG. 1 is a simplified block diagram of a monitoring and controlling system in accordance with an aspect of the present invention.

The present invention will now be described with reference to the drawings, wherein like reference numerals are used to refer to like elements throughout. The present invention will be described with reference to a system for controlling a mask alignment process using a plurality of mask alignment components and a scatterometry system including one or more light sources and one or more light detecting devices. The following detailed description is of the best modes presently contemplated by the inventors for practicing the invention. It should be understood that the description of these aspects are merely illustrative and that they should not be taken in a limiting sense.

Referring initially to FIG. 1, a block diagram of a monitoring and controlling system 10 is illustrated for monitoring and controlling the shape, depth and/or width of apertures 12 being etched in a mask 14 in accordance with an aspect of the present invention. The mask 14 is operatively coupled to a mask etching system 16. By way of illustration, the mask etching system 16 is able to etch apertures 12 of various shapes, depths and widths in the mask 14.

The system 10 also includes a measurement component 18 operable to measure the shape, depth and/or width of the apertures 12 in the mask 14 in accordance with an aspect of the present invention. The measurement component 18 includes, for example, a light source that emits a beam 19 incident to the surface of the mask 14. The beam 19 interacts the mask 14 and the apertures 12 in the mask 14 and is reflected and/or diffracted. The measurement component 18 also includes a detection system for detecting the reflected and/or diffracted light (also indicated as 19 for purposes of brevity). Characteristics (e.g. shape, depth, width) of the apertures 12 are determined based on the properties of the reflected and/or diffracted light 19. The system 10 also includes a control system 17 operatively coupled to the etching system 16 and the measurement component 18. The control system 17 is programmed and/or configured to control operation of the etching system 16 in accordance with an aspect of the present invention.

Figure 2:
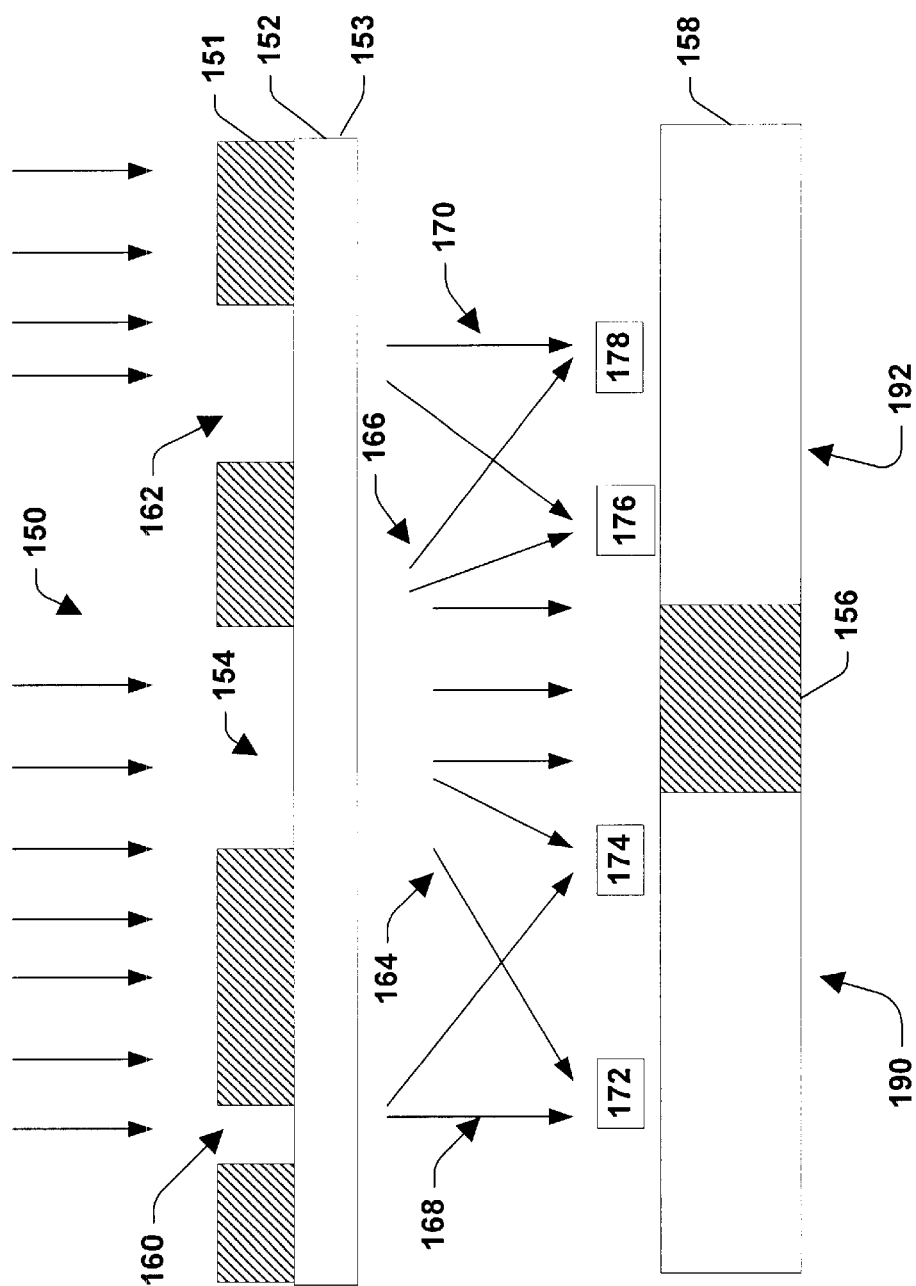
FIG. 2 illustrates light waves passing through a mask employed in complimentary phase shift masking in accordance with an aspect of the present invention.
Figure 3:
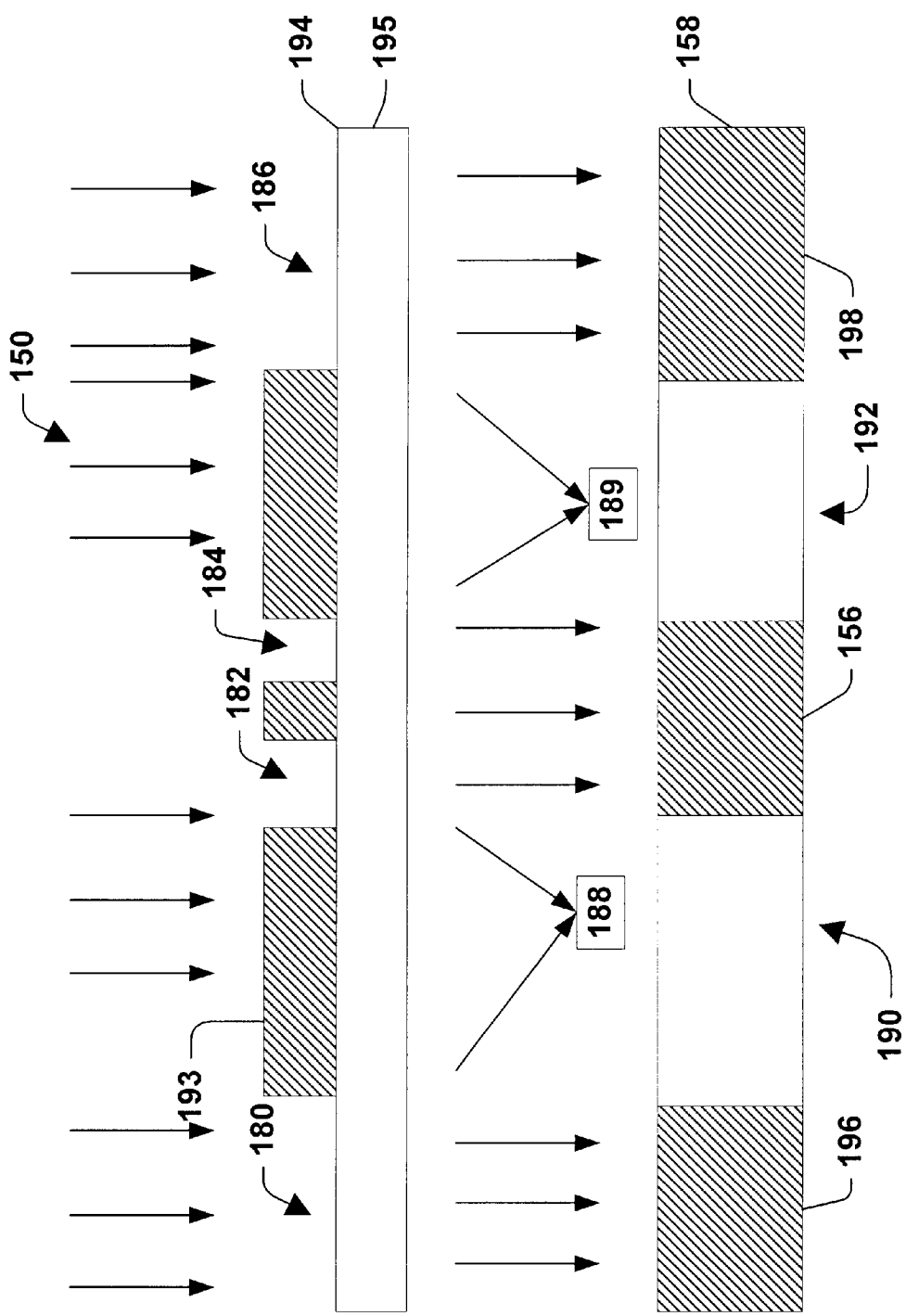
FIG. 3 illustrates light waves passing through a mask employed in complimentary phase shift masking in accordance with an aspect of the present invention.

FIG. 2 and FIG. 3 briefly illustrate the operation of diffraction and cancellation in complimentary phase shift masking. Detailed discussion of complimentary phase shift masking is omitted for brevity, as it is a technique well known in the art. From within the following discussion of complimentary phase shift masking, it is the fact that openings in a complimentary phase shift mask must be fabricated within an acceptable tolerance to enable the interference and cancellation required for the operation of complimentary phase shift masking that should be focused on, since the present invention facilitates improving such tolerances.

Referring now to FIG. 2, light waves 150 are directed at a mask 152. The mask 152 includes a quartz substrate layer 153 through which the light waves 150 may pass and an opaque chrome layer 151, through which the light waves 150 may not pass. The mask 152 is designed to be employed in complimentary phase shift masking to produce two desired features 190 and 192 on a photo resist 158. Some of the light waves 150 pass directly through an aperture 154 and expose a region 156 on the photo resist 158. Other of the light waves 150 are diffracted when they pass through the aperture 154. The diffraction is affected by the factors including, but not limited to the depth and/or width of the aperture 154. Similarly, the depth and the width of the aperture 154 affect the phase shift, of any, of the light waves 150 passing through the aperture 154.

Wave 164 is a light wave diffracted to the left while light wave 166 is a light wave diffracted to the right. Other of the light waves 150 pass through apertures 160 and 162. Again, the diffraction and phase shifting of the light passing through the apertures 160 and 162 is affected by the depth and/or width of the apertures 160 and 162. For example light wave 168 passes directly through aperture 160 and interacts with diffracted light wave 164 at region 172, which due to the difference in phases between the light waves 164 and 168 causes total cancellation of the light waves 164 and 168, and thus the region under aperture 160 is not exposed. Similarly light wave 170 passes directly through aperture 162 and interacts with diffracted wave 166 at region 178 where cancellation occurs. Other cancellation occurs between waves diffracted through aperture 160 and aperture 154 at region 174 and between waves diffracted through aperture 162 and aperture 154 at region 176. Such cancellation enables square edges to be produced for the region 156. Thus, by fabricating the mask 152 with complimentary structures, the region 156 between the desired features 190 and 192 may be developed with a smaller feature size and more precise features, if the diffraction and phase shifting desired by the mask 154 can be accomplished.

Turning now to FIG. 3, the light waves 150 are directed at a second mask 194 in which there are a plurality of apertures 180, 182, 184 and 186. The mask 194 includes a quartz layer 195 through which the light waves 150 may pass. The mask 194 also includes an opaque chrome layer 193 through which the light waves 150 may not pass. Some of the light waves 150 pass directly through the apertures 180, 182, 184 and 186, exposing regions on the photo resist 158 (e.g., regions 196 and 198) while other of the light waves 150 are diffracted by the apertures 180, 182, 184 and 186. As in FIG. 3, some of these light waves interact and cancel, as for example at regions 188 and 189. The present invention enables the openings in the second mask 194 to be fabricated within a desired tolerance to control the diffraction and phase shifting of light passing through apertures on the second mask 194 thus enabling desired cancellation at regions 188 and 189 and resulting smaller sizes of desired features 190 and 192, with more precise feature shapes.

Figure 4:
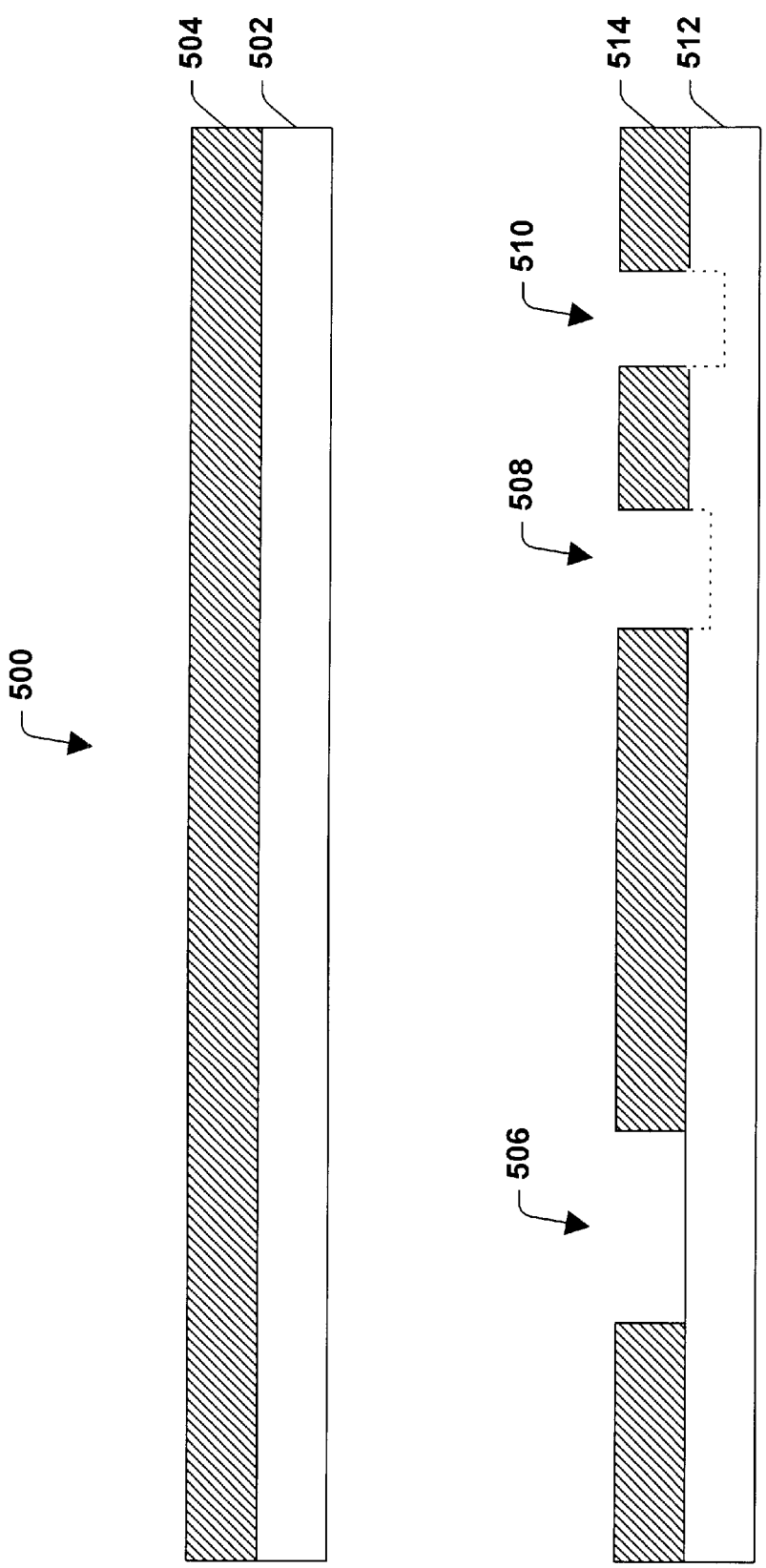
FIG. 4 illustrates an un-patterned complimentary phase shift mask, formed of a quartz layer and a chrome layer, and a completed complimentary phase shift mask in accordance with an aspect of the present invention.
Figure 5:
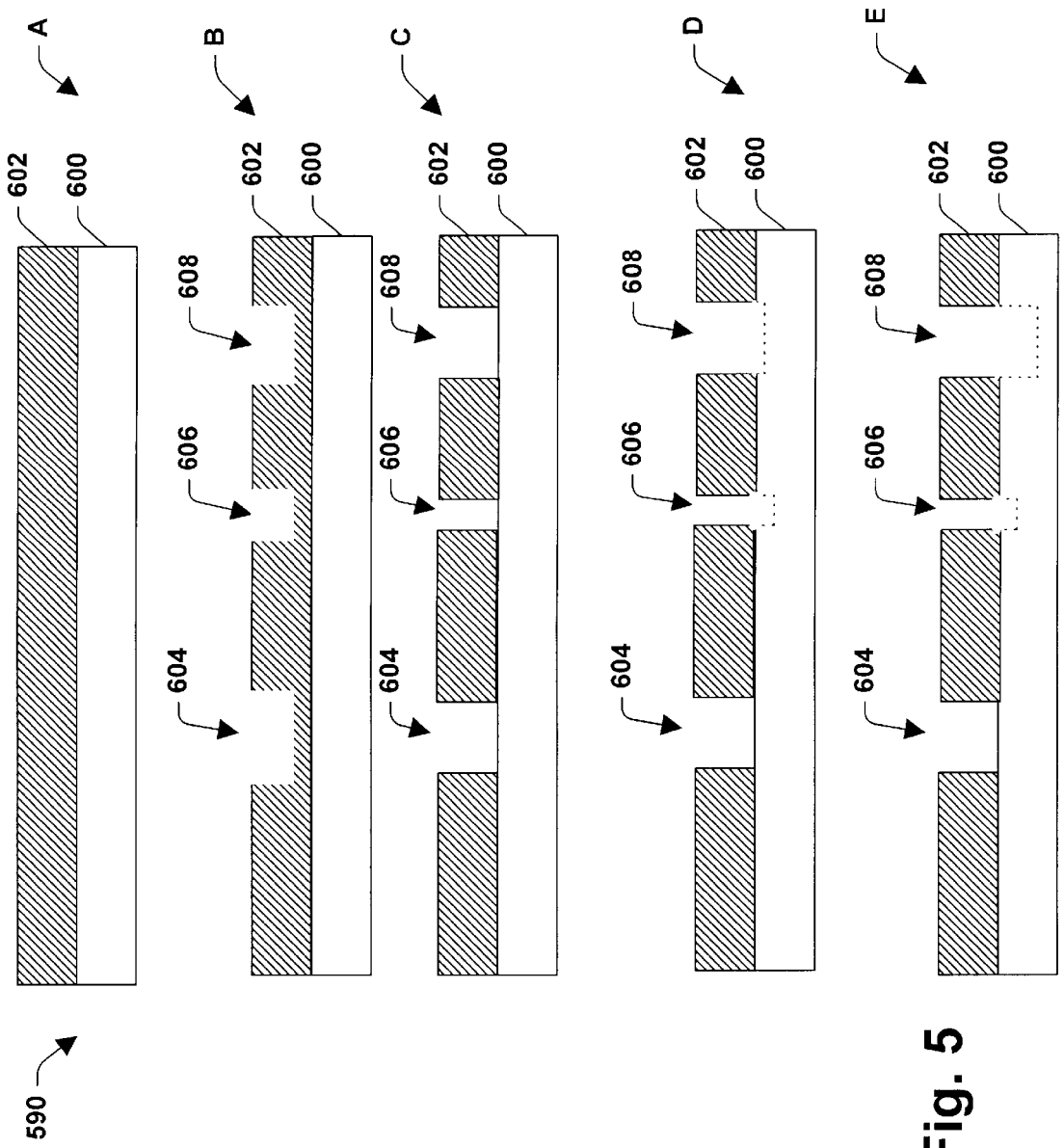
FIG. 5 illustrates a complimentary phase shift mask at different stages of development as processed in accordance with an aspect of the present invention.

Turning now to FIG. 4, a complimentary phase shift mask 500 is illustrated. The mask includes a quartz layer 502, through which light waves may pass, and an opaque chrome layer 504, through which light waves may not pass. There are no apertures etched into the mask 500. FIG. 5 also illustrates a processed complimentary phase shift mask 510 which similarly includes a quartz layer 512, through which light waves may pass, and an opaque chrome layer 514, through which light waves may not pass. But the processed complimentary phase shift mask 510 also includes three apertures 516, 518 and 520, through which light may pass. The aperture 516 was fabricated by etching away substantially all of the chrome layer 514 at the location of the aperture 516. But practically none of the quartz layer 512 at the location of the aperture 516 was etched away. The aperture 518 was fabricated by etching away substantially all of the chrome layer 514 at the location of the aperture 518 and a small portion of the quartz layer 512 at the location of the aperture 518. The aperture 520 was fabricated by etching away substantially all of the chrome layer 514 at the location of the aperture 520 and a portion of the quartz layer 512 at the location of the aperture 520. The quartz layer 512 was removed to a greater depth to form the aperture 520. The different depths and widths of the apertures 516, 518 and 520 will have different effects on diffracting light that passes through the apertures 516, 518 and 520 and will similarly have different effects on shifting the phase of light that passes through the apertures 516, 518 and 520. Thus precise control of the depth and/or width of the apertures 516, 518 and 520 is required.

Turning now to FIG. 5, a complimentary phase shift mask 590 is illustrated at five different stages of an aperture fabrication process. At step A, a quartz layer 600 and a chrome layer 602 have been prepared for processing, but no apertures have been etched into either the quartz layer 600 or the chrome layer 602. At step B, three apertures 604, 606 and 608 have been etched into the chrome layer 602. The present invention facilitates monitoring the depth of the etched apertures 604, 606 and 608 via scatterometry means, as will be described below. At step B, a determination can be made that the depth and/or width of one or more of the apertures 604, 606 and 608 require further etching. Thus, at step C, the mask 590 has been further etched to deepen the apertures 604, 606 and 608. At step C, a determination can similarly be made that one or more of the apertures 604, 606 and 608 require further etching. Thus, at step D, the mask 590 has been further etched to deepen the apertures 606 and 608, while the aperture 604 has not been further etched. At step D, a determination can similarly be made that one or more of the apertures 604, 606 and 608 require further etching. Thus, at step E, the mask 590 has been further etched to deepen the aperture 608, while the apertures 604 and 606 have not been further etched. The present invention thus enables etching apertures of differing depths where the fabrication of the different depths are monitored and controlled. Enabling etching of apertures of varying widths and/or depths thus enables controlling diffraction and/or phase shifting of light waves that pass through the apertures, with a resulting increase in the fidelity of image transfer.

Figure 6:
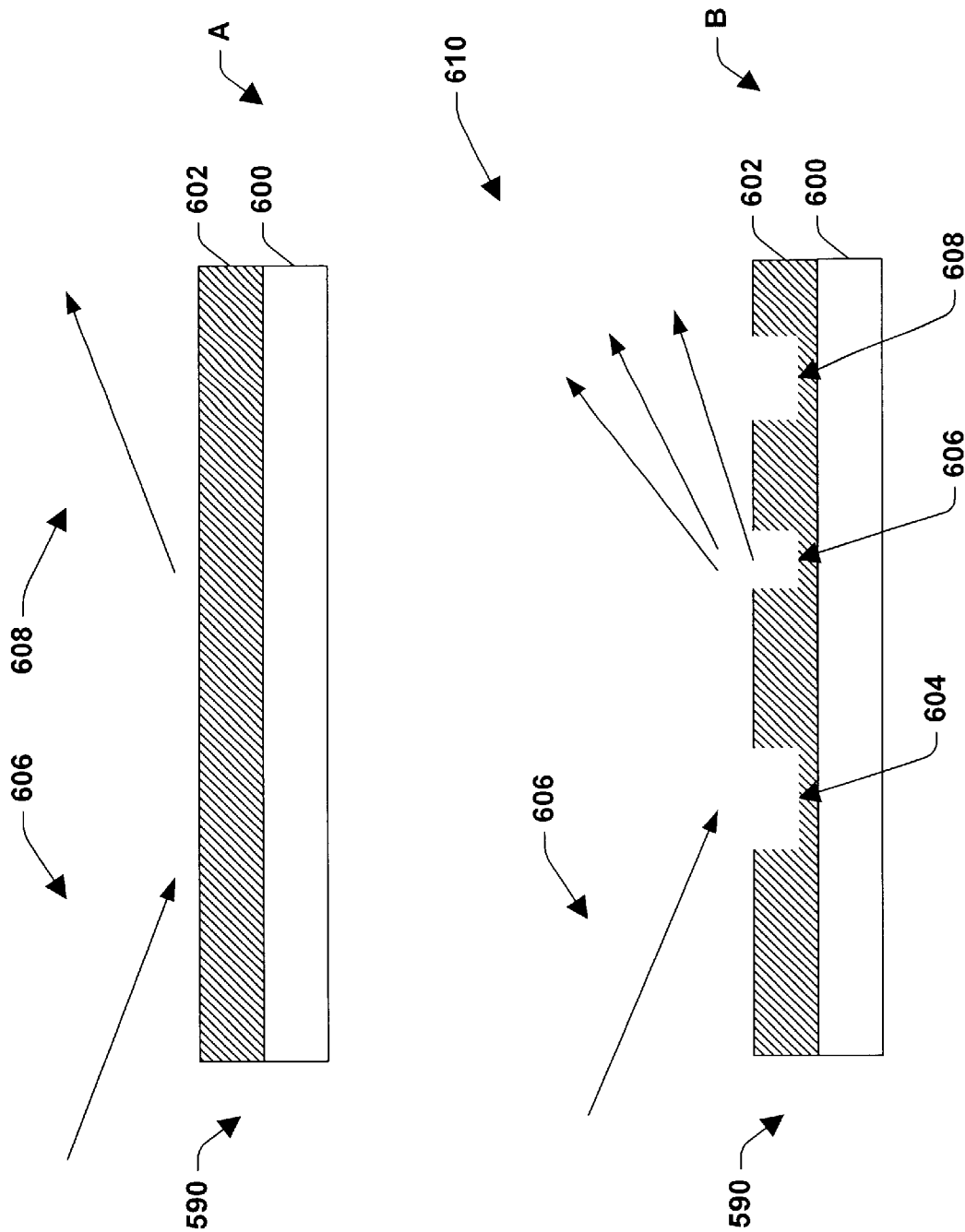
FIG. 6 illustrates a light beam being reflected and/or diffracted from the surface of two complimentary phase shift masks; one that is patterned and one that is not, in accordance with an aspect of the present invention.

Turning now to FIG. 6, the complimentary phase shift mask 590 is illustrated with a light beam 606 directed onto the surface of the mask 590. At step A of a mask fabrication process, the light beam 606 may reflect off the substantially planar surface of the mask 590, as illustrated by reflected light beam 608. But at step B of the fabrication process, the light beam 606 may reflect and/or diffract off the no longer substantially planar surface of the mask 590. The chrome layer 602, having been etched with the apertures 604, 606 and 608 will reflect the light beam 606 and may also diffract the light beam 606 into one or more resulting light beams 610. The light beams 610 will be reflected and/or diffracted into different patterns (signatures) that may be analyzed to determine the width and/or depth of the apertures 604, 606 and 608, and thus the fabrication process may be controlled via feedback information generated from the width and/or depth determinations made, at least in part, by analyzing the reflected and/or diffracted light beams 610. As will be illustrated below, the reflected and/or diffracted light beams 610 can be analyzed in the present invention via scatterometry means.

Figure 7:
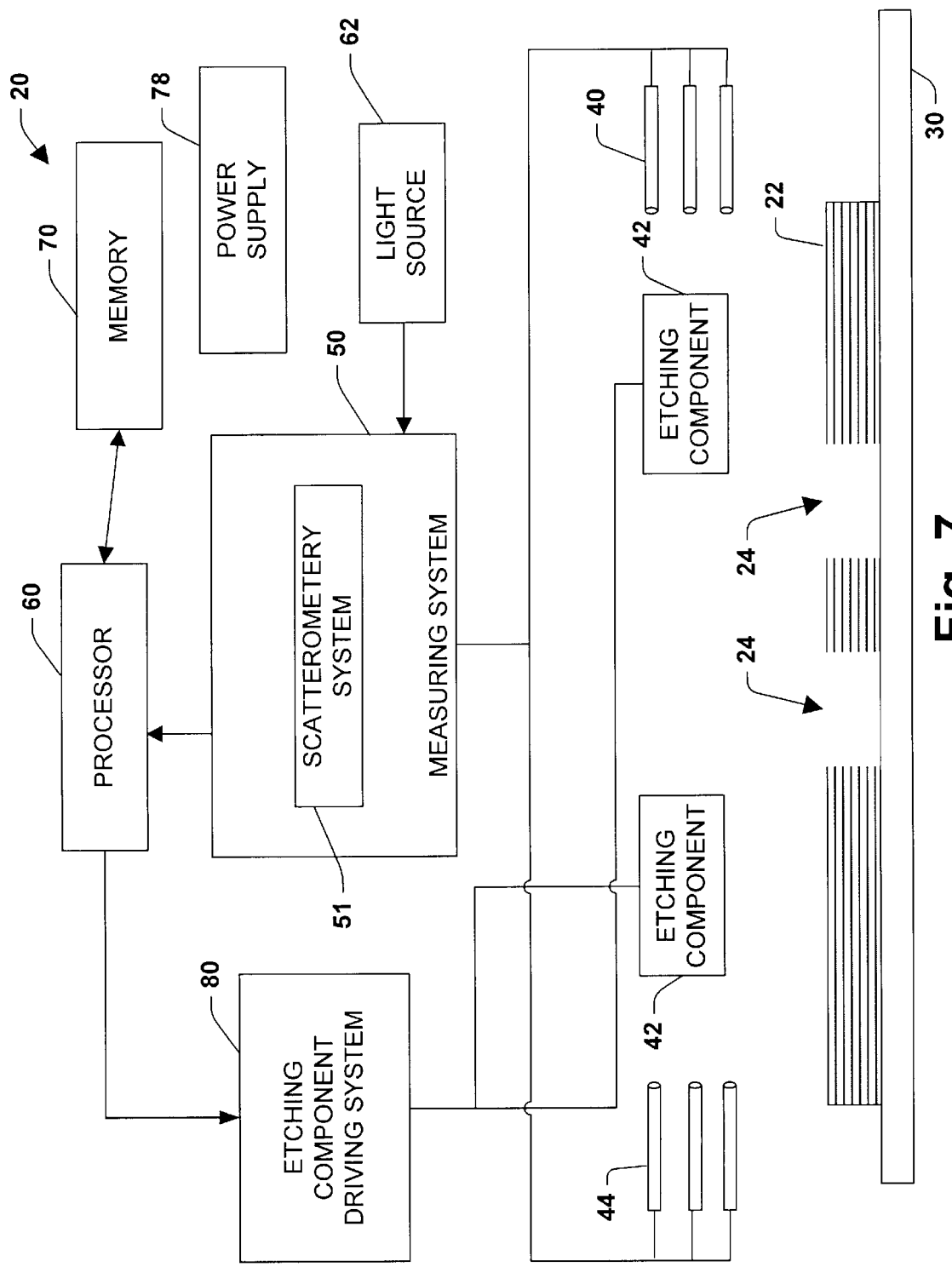
FIG. 7 is a schematic block diagram of a monitoring and controlling system in accordance with an aspect of the present invention.

Turning now to FIG. 7, a system 20 for measuring and controlling fabrication of apertures 24 in a complimentary phase shift mask 22 is further illustrated. One or more etching components 42 will etch the apertures 24 in the mask 22. One or more light sources 44 project light onto respective portions of the mask 22. A portion may have one or more apertures 24 on that portion. Light reflected by the mask and/or apertures 24 is collected by one or more light detecting components 40, and processed by an opening parameter measuring system 50 to measure at least one parameter relating to the opening fabrication. The reflected light is processed with respect to the incident light in measuring the various parameters. The depth and/or width of the apertures 24 will cause the reflected light to be reflected in different, quantifiable manners. The reflected light may thus generate aperture signatures, which can be used to allow feedback control of the etching components via the etching component driving system 80.

The measuring system 50 includes a scatterometry system 51. It is to be appreciated that any suitable scatterometry system may be employed to carry out the present invention and such systems are intended to fall within the scope of the claims appended hereto. A source of light 62 (e.g., a laser) provides light to the one or more light sources 44 via the measuring system 50. Preferably, the light source 62 is a frequency stabilized laser, however, it will be appreciated that any laser or other light source (e.g., laser diode or helium neon (HeNe) gas laser) suitable for carrying out the present invention may be employed. One or more light detecting components 40 (e.g., photo detector, photo diodes) collect light reflecting from or passing through the apertures 24.

A processor 60 receives the measured data from the measuring system 50 and determines the depth and/or width of the apertures 24. The processor 60 is operatively coupled to the measuring system 50 and is programmed to control and operate the various components within the system 20 in order to carry out the various functions described herein. The processor, or CPU 60, may be any of a plurality of processors, such as the AMD Athlon, K7 and/or other similar and compatible processors. The manner in which the processor 60 can be programmed to carry out the functions relating to the present invention will be readily apparent to those having ordinary skill in the art based on the description provided herein.

A memory 70, which is operatively coupled to the processor 60, is also included in the system 20 and serves to store program code executed by the processor 60 for carrying out operating functions of the system 20 as described herein. The memory 70 also serves as a storage medium for temporarily storing information such as aperture depth and/or width requirements, aperture signature tables, aperture coordinate tables, aperture sizes, aperture shapes, scatterometry information, and other data that may be employed in carrying out the present invention.

A power supply 78 provides operating power to the system 20. Any suitable power supply (e.g., battery, line power) may be employed to carry out the present invention. The processor 60 is also coupled to an etching component driving system 80 that drives the etching components 42. The processor 60 controls the etching component driving system 80 to selectively control the etching components 42. The processor 60 monitors the apertures 24 via the signatures generated by reflected and/or diffracted light, and selectively regulates the etching of the apertures 24 via the corresponding etching components 42. Such regulation enables controlling the shape, depth and/or width of the apertures 24 and thus enables the phase shifting employed in phase shift masking, which in turn improves fidelity of image transfer in a lithographic process. Improved precision of image transfer enables smaller feature sizes and thus enables higher packing densities.

Figure 8:
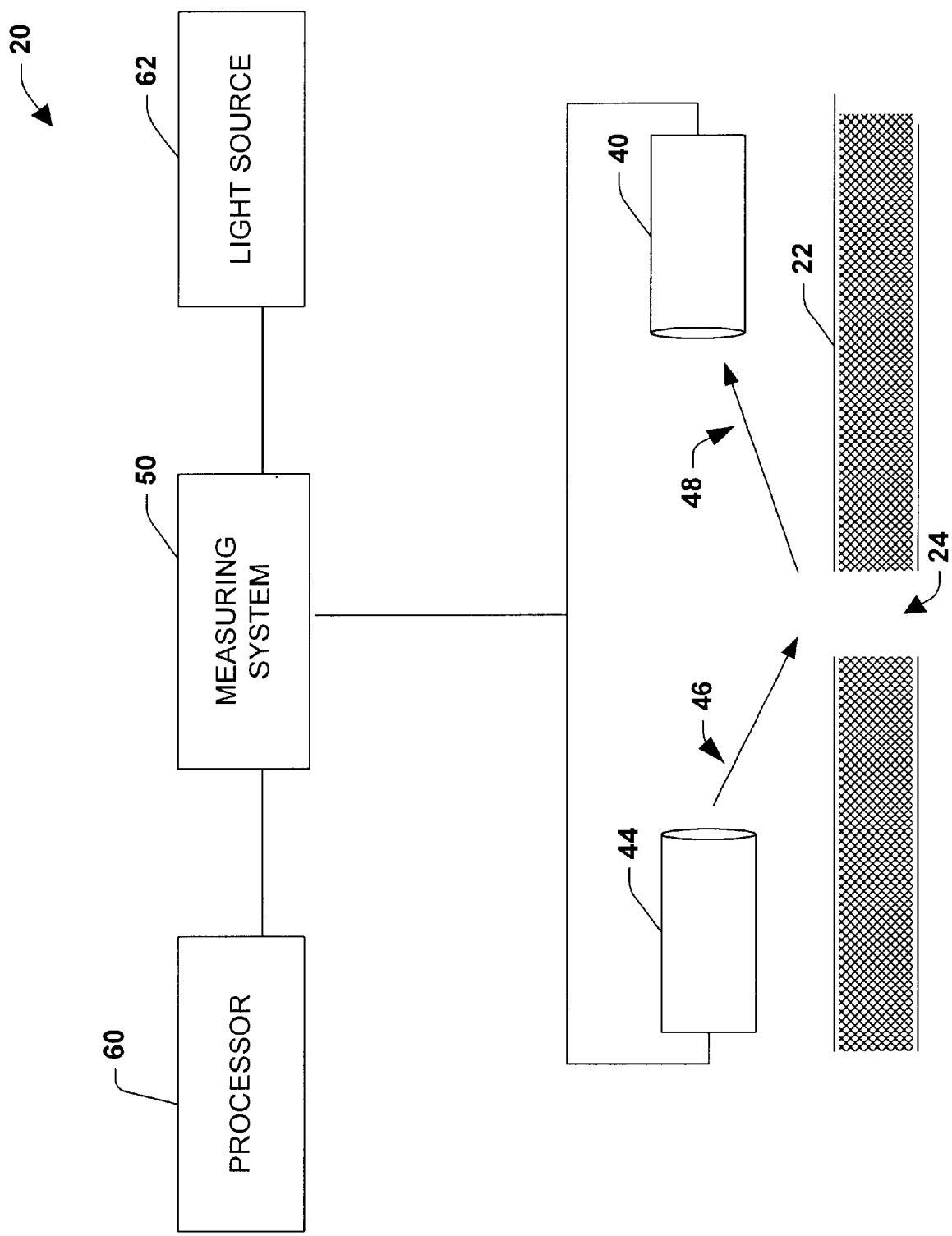
FIG. 8 is a partial schematic block diagram of the system of FIG. 7 illustrating one example of a system for measuring complimentary phase shift mask opening fabrication in accordance with the an aspect of present invention.

FIG. 8 illustrates the system 20 being employed to measure the depth and/or width of an aperture 24 via light reflected from the aperture 24. The light source 44 directs a light 46 incident to the surface of the mask 22. The angle of a light 48 reflected and/or diffracted from the surface of the mask 22 will vary in accordance with the width and/or depth of the aperture 24. The one or more light detecting components 40 collect the reflected and/or diffracted light 48, pass the collected light, and/or data concerning the collected light, to the measuring system 50, which processes the reflected light 48 and/or data concerning the reflected light 48 in accordance with scatterometry techniques to provide the processor 60 with data corresponding to the depth and/or width of the aperture 24 in the mask 22. The reflected light 48 may generate a signature that can be compared to one or more signatures to determine whether the etching process should continue. For example, the signature may indicate that the aperture 24 has not reached a desired depth and that further etching should occur.

Turning now to FIGS. 9–11 a chuck 30 is shown in perspective supporting a mask 22 whereupon one or more apertures 24 may be located. The mask 22 may be divided into a grid pattern as shown in FIG. 10. Each grid block (XY) of the grid pattern corresponds to a particular portion of the mask 22, and each grid block may have one or more apertures 24 associated with that grid block. Each portion is individually monitored for aperture width and depth, and each portion is individually controlled for etching. It is to be appreciated that although one or more etching components 42 are illustrated as being associated with each grid block that a greater or lesser number of etching components 42 may be employed in the present invention.

In FIG. 10, one or more apertures 24 in the respective portions of the mask 22 ($X_1Y_1 \ldots X_{12}, Y_{12}$) are being monitored for depth and/or width using reflective light, the measuring system 50 and the processor 60. The signatures for the apertures 24 are shown. It is to be appreciated that although FIG. 10 illustrates the mask 22 being mapped (partitioned) into 144 grid block portions, the mask 22 may be mapped with any suitable number of portions and any suitable number of apertures 24 may be fabricated. Although the present invention is described with respect to one etching component 42 corresponding to one aperture 24, it is to be appreciated that any suitable number of etching components 42 corresponding to any suitable number of apertures 24 may be employed. Given the set of signatures recorded in FIG. 12, the processor 60 may determine that an undesirable etching condition exists for one or more apertures 24 on the mask 22. Accordingly, the processor 60 may drive one or more etching components 42 to bring the aperture with the undesirable etching condition to a desired depth and/or width. It is to be appreciated that the etching components 42 may be driven so as to increase or decrease the rate of etching. When the processor 60 determines than the etching process, as determined by analyzing the signatures, has reached a desired condition, the processor 60 may terminate etching. It is possible that a determination may be made that a desired depth and/or condition may not be achieved, at which point the mask may be marked for further processing and/or destruction, for example.

FIG. 11 illustrates a table of acceptable and unacceptable signatures. It can be seen that all the signatures are acceptable except a signature for grid $X_7Y_6$. The set of signatures depicted in FIG. 11 can be analyzed collectively as a master signature, can be analyzed in subsets to evaluate, for example, intermediate etching progress, and/or can be analyzed individually to determine whether an acceptable etching condition exists. The analysis of the signatures is used to control the etching component driving system 80 (FIG. 7), so that finer depth and/or width control of the etching may be achieved.

Figure 12:
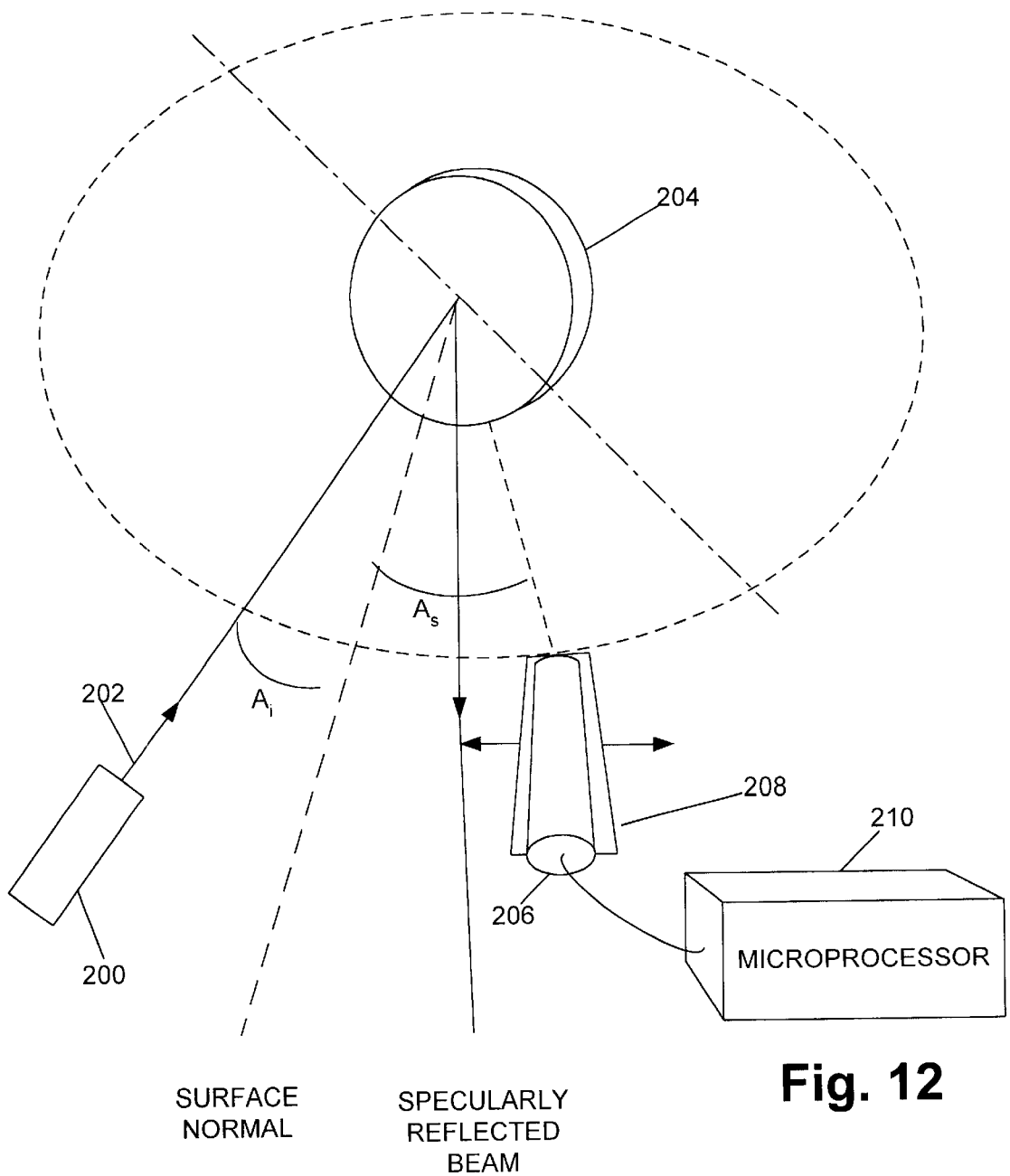
FIG. 12 illustrates an exemplary scatterometry system collecting reflected light in accordance with an aspect of the present invention.

FIG. 12 illustrates an exemplary scatterometry system collecting reflected and/or diffracted light. Light from a laser 200 is brought to focus in any suitable well-known manner to form a beam 202. A sample, such as a mask 204 is placed in the path of the beam 202 and a photo detector or photo multiplier 206 of any suitable well-known construction. Different detector methods may be employed to determine the scattered power. To obtain a grating pitch, the photo detector or photo multiplier 206 may be mounted on a rotation stage 208 of any suitable well-known design. A microprocessor 210, of any suitable well-known design, may be used to process detector readouts, including, but not limited to, angular locations of different diffracted orders leading to diffraction grating pitches being calculated. Thus, light reflected and/or diffracted from the sample 204 may be accurately measured.

Figure 13:
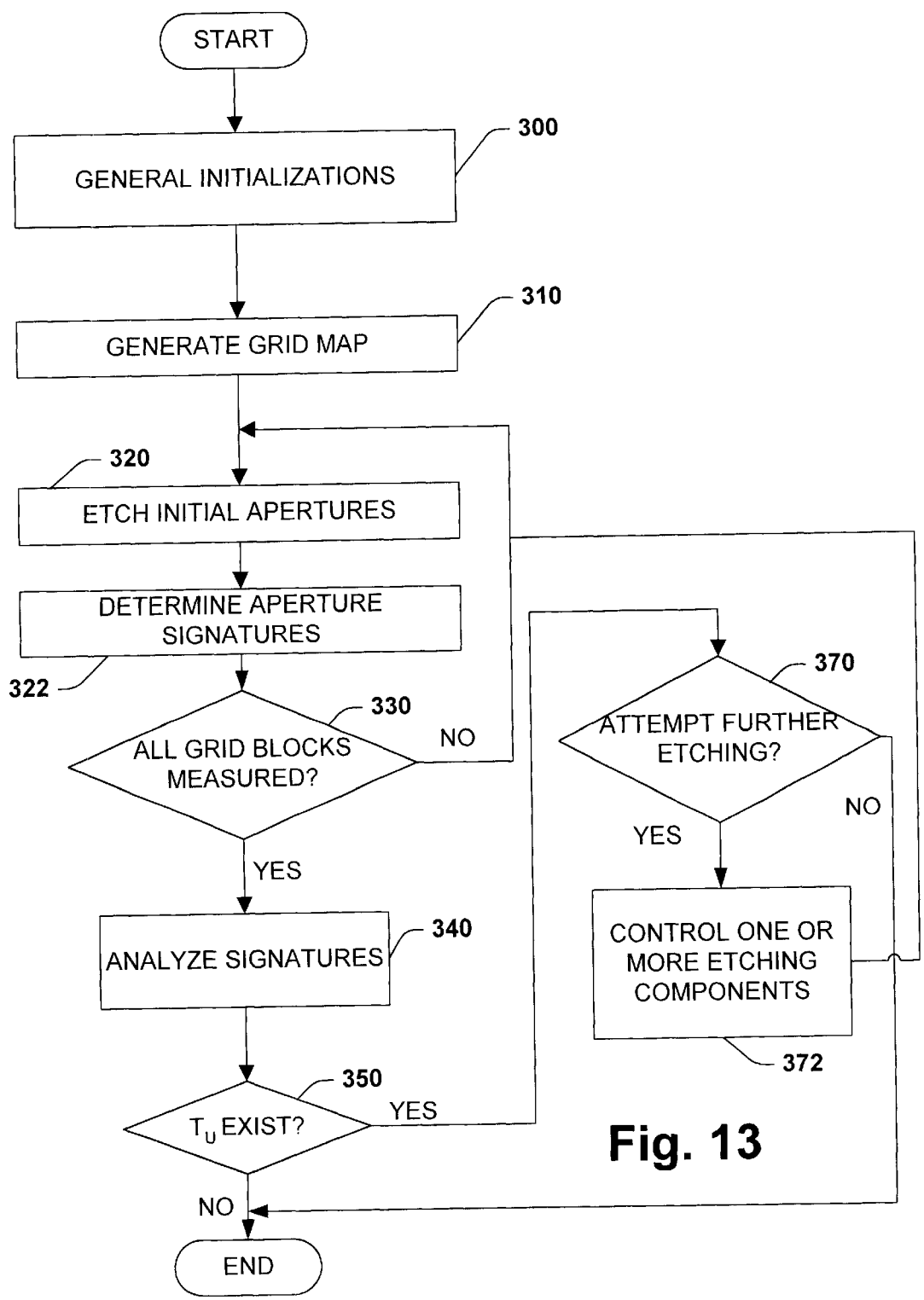
FIG. 13 is a flow diagram illustrating an example of a methodology for monitoring and controlling fabrication of openings in a complimentary phase shift mask in accordance with an aspect of the present invention.
Figure 15:
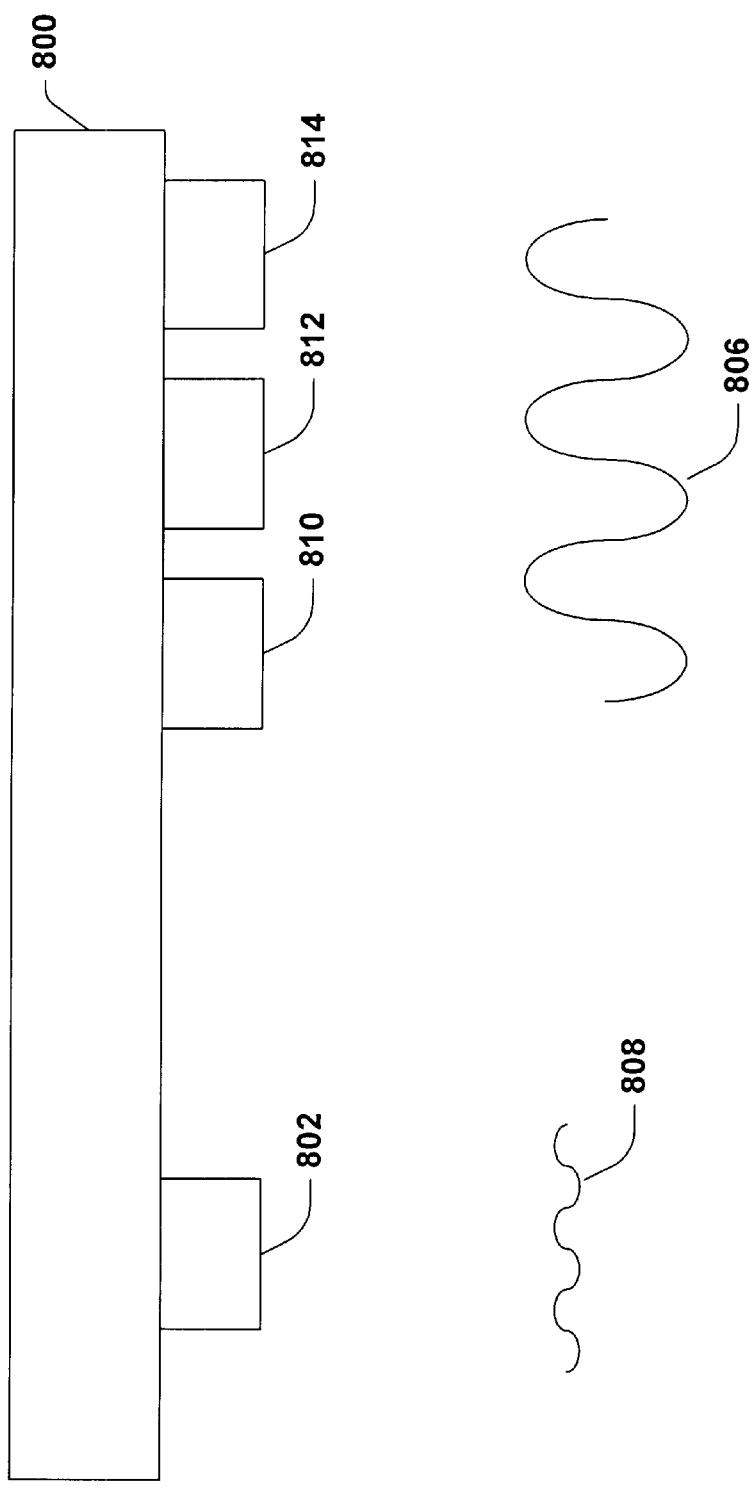
FIG. 15 is an aerial intensity plot of isolated and periodic structures on a mask.
Figure 16:
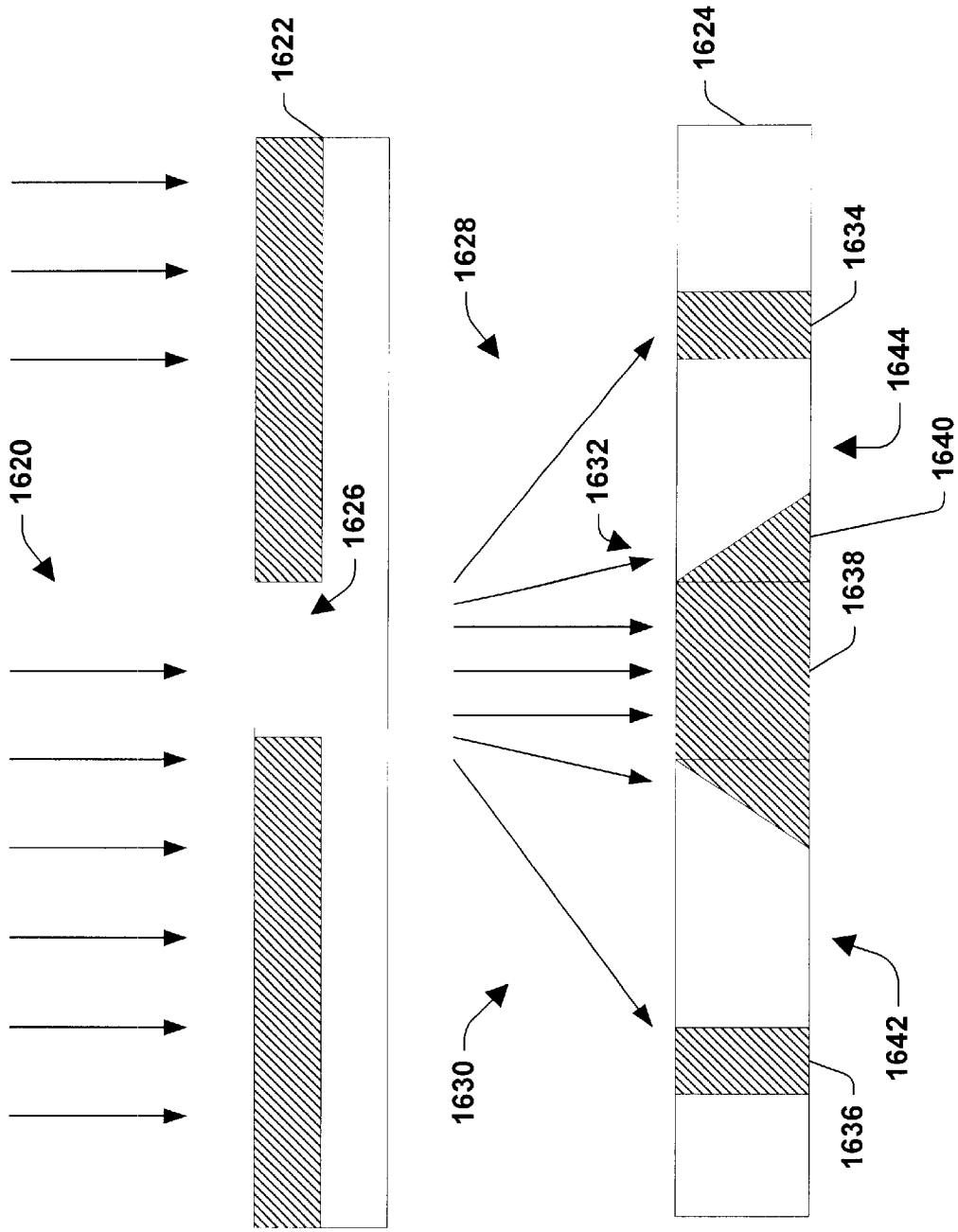
FIG. 16 illustrates conventional lithography wherein light waves passing through a mask are being diffracted.

In view of the exemplary systems shown and described above, a methodology, which may be implemented in accordance with the present invention, will be better appreciated with reference to the flow diagrams of FIGS. 13 and 15. While, for purposes of simplicity of explanation, the methodologies of FIG. 13 and FIG. 15 are shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 13 is a flow diagram illustrating one particular methodology for carrying out the present invention. At 300, a processor performs general initializations to an etching system. The initializations may include, but are not limited to, establishing desired aperture depths and/or widths, establishing data communications, fetching desired aperture signatures and positioning fabrication means and products. At 310, the processor maps at least a portion of a mask into a plurality of grid blocks "XY". At 320, one or more apertures are initially etched in the mask. At 322, aperture signature determinations are made with respect to the various wafer portions mapped by the respective grid blocks XY. At 330, the processor determines if all grid block signatures have been taken. If the determination at 330 is NO, then the processor returns to 320. If the determination at 330 is YES, then at step 340, the processor analyzes the signature or signatures against a table of acceptable signatures. At 350, the processor determines if the signatures are acceptable. If the signatures are acceptable, the processor ends the iteration of the etching process. If at 350 an unacceptable signature is found, the process advances to 370 where a determination is made concerning whether further etching attempts will be made. If no further attempts are to be made, then the mask can be marked for further processing and/or destruction and alarms may be sent to subsequent methods and/or apparatus concerning the unacceptably etched portion of the mask, after which the etching process concludes. If the determination at 370 is YES, then at 372 the processor controls relevant etching components to further etch the apertures and achieve a more precise depth and/or width of the apertures. The present iteration is then ended and the process returns to 320 to perform another iteration.

Figure 14:
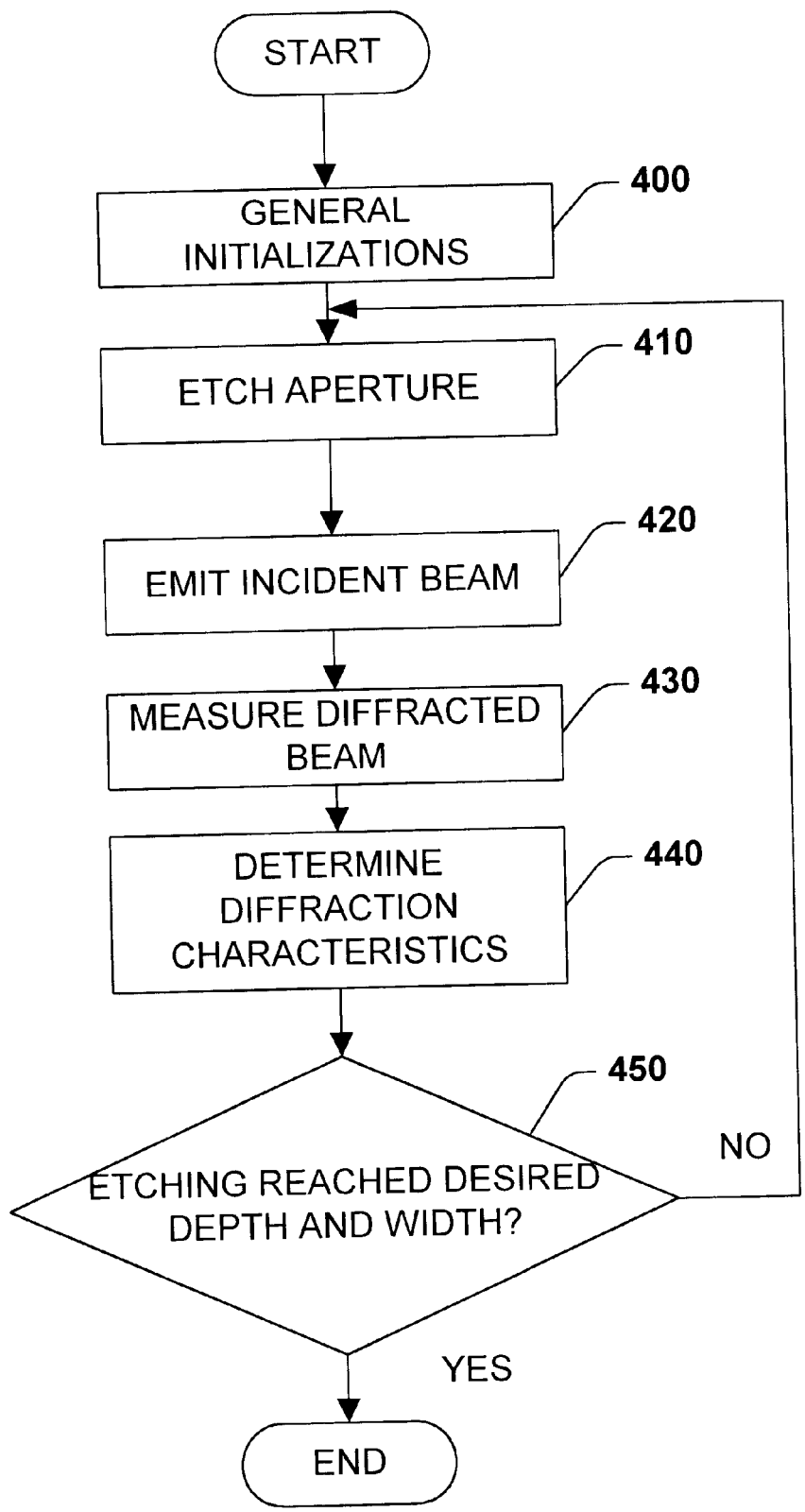
FIG. 14 is a flow diagram illustrating another example of a methodology for monitoring and controlling fabrication of openings in a complimentary phase shift mask in accordance with an aspect of the present invention.

FIG. 14 is a flow diagram illustrating another particular methodology for carrying out the present invention. At 400 general initializations and/or configurations are performed. At 410, the etching of the apertures begins. At 420, an incident beam is emitted onto one or more apertures and at 430 the beam diffracted from the one or more apertures is measured. At 440, the signatures from the apertures upon which the incident beam of 420 was directed and which produced the diffracted beam of 430 are analyzed. At 450 a determination is made concerning whether the apertures have been etched to a desired depth and/or width. If the determination at 450 is YES, then the etching terminates. If the determination at 450 is NO, then processing returns to 410. It is to be appreciated by one skilled in the art that while the steps in FIG. 14 are shown in a linear order, that emitting the incident beam, measuring the diffracted beam and determining whether the etching process has produced apertures of a desired width and depth may occur simultaneously to facilitate providing in situ feedback and control.

Scatterometry is a technique for extracting information about a surface upon which an incident light has been directed. Information concerning properties including, but not limited to, dishing, erosion, profile, thickness of thin films and critical dimensions of features present on the surface can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 17:
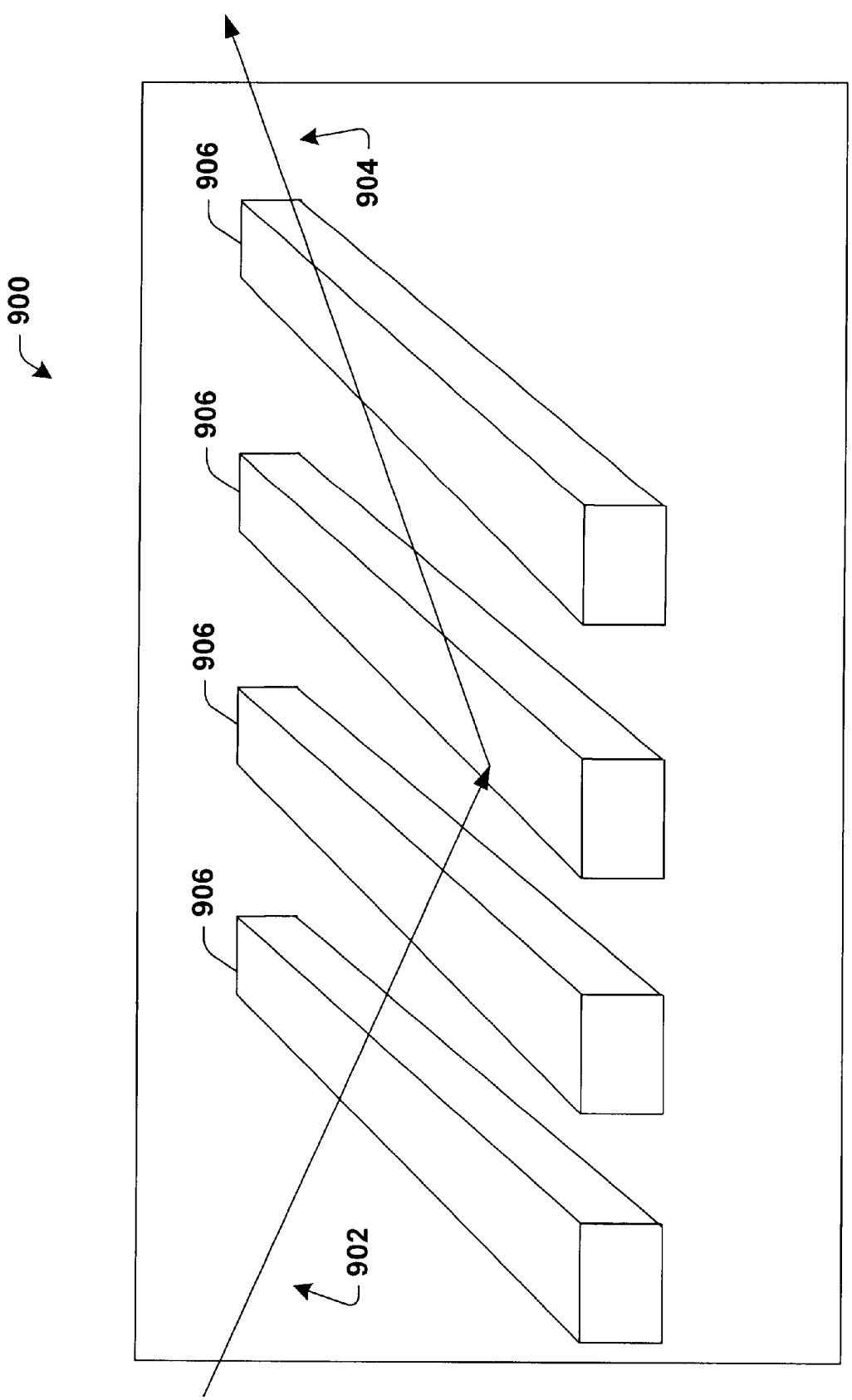
FIG. 17 is a simplified perspective view of an incident light reflecting off a surface, in accordance with an aspect of the present invention.
Figure 22:
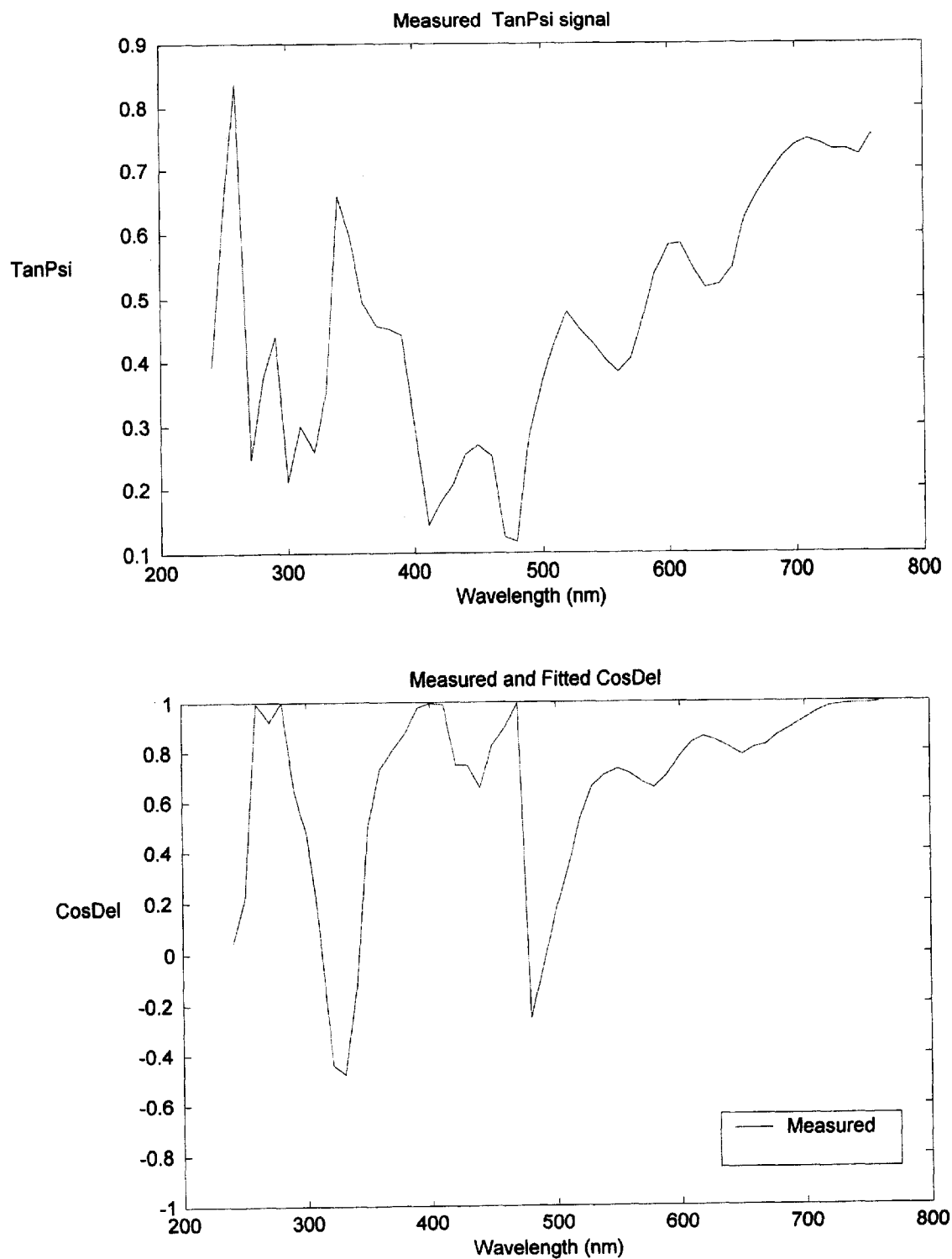
FIG. 22 illustrates phase and intensity signals recorded from a complex reflected and refracted light produced when an incident light is directed onto a surface, in accordance with an aspect of the present invention.

To illustrate the principles described above, reference is now made to FIGS. 17 through 22. Referring initially to FIG. 17, an incident light 902 is directed at a surface 900, upon which one or more features 906 may exist. In FIG. 17 the incident light 902 is reflected as reflected light 904. The properties of the surface 900, including but not limited to, thickness, uniformity, planarity, chemical composition and the presence of features, can affect the reflected light 904. In FIG. 17, the features 906 are raised upon the surface 900. The phase and intensity of the reflected light 904 can be measured and plotted, as shown, for example, in FIG. 22. The phase 960 of the reflected light 904 can be plotted, as can the intensity 962 of the reflected light 904. Such plots can be employed to compare measured signals with signatures stored in a signature library using techniques like pattern matching, for example.

Figure 18:
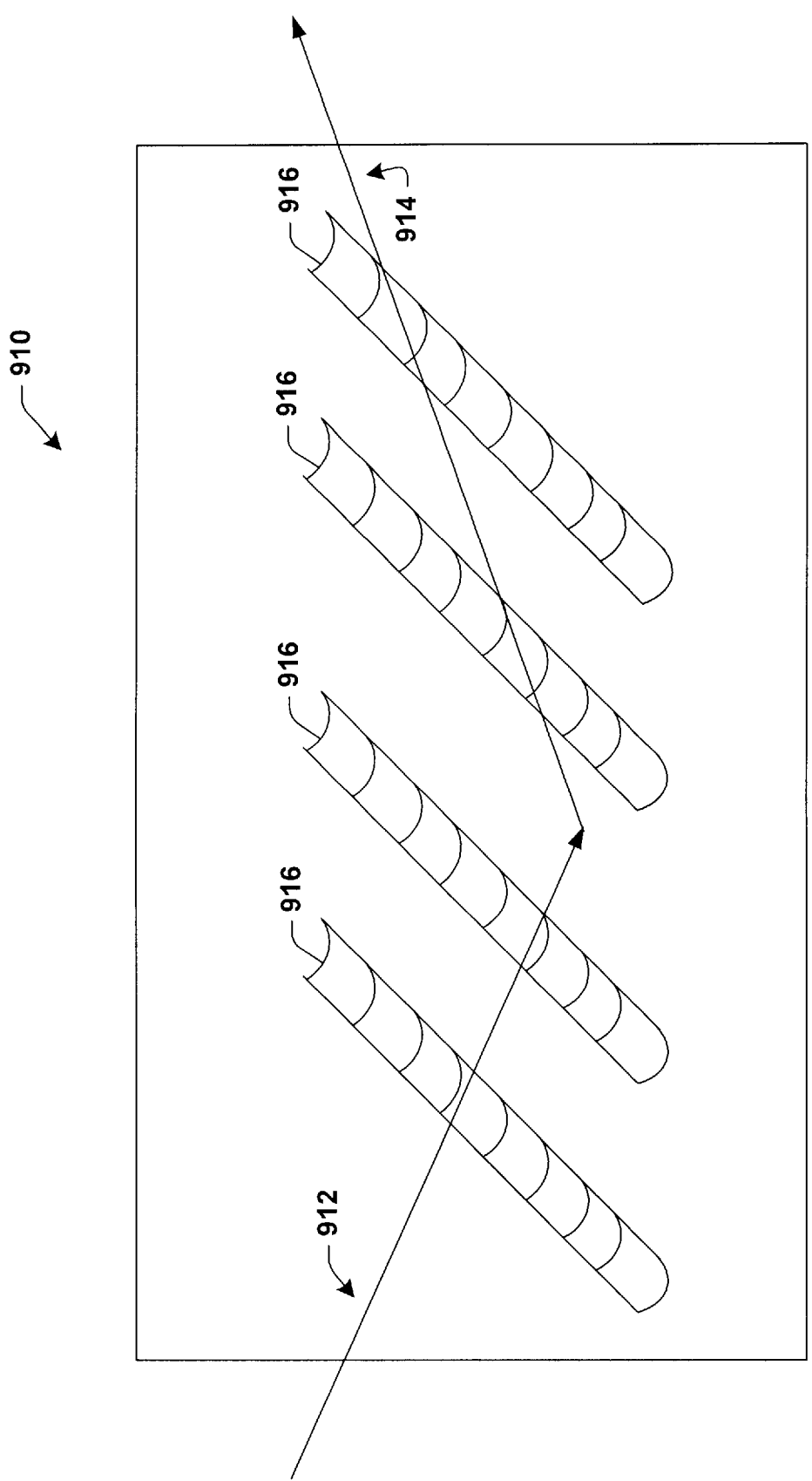
FIG. 18 is a simplified perspective view of an incident light reflecting off a surface, in accordance with an aspect of the present invention.

Referring now to FIG. 18, an incident light 912 is directed onto a surface 910 upon which one or more depressions 916 appear. The incident light 912 is reflected as reflected light 914. Like the one or more features 906 (FIG. 17) may affect an incident beam, so too may the one or more depressions 916 affect an incident beam. Thus, it is to be appreciated by one skilled in the art that scatterometry can be employed to measure features appearing on a surface, features appearing in a surface, and properties of a surface itself, regardless of features.

Figure 19:
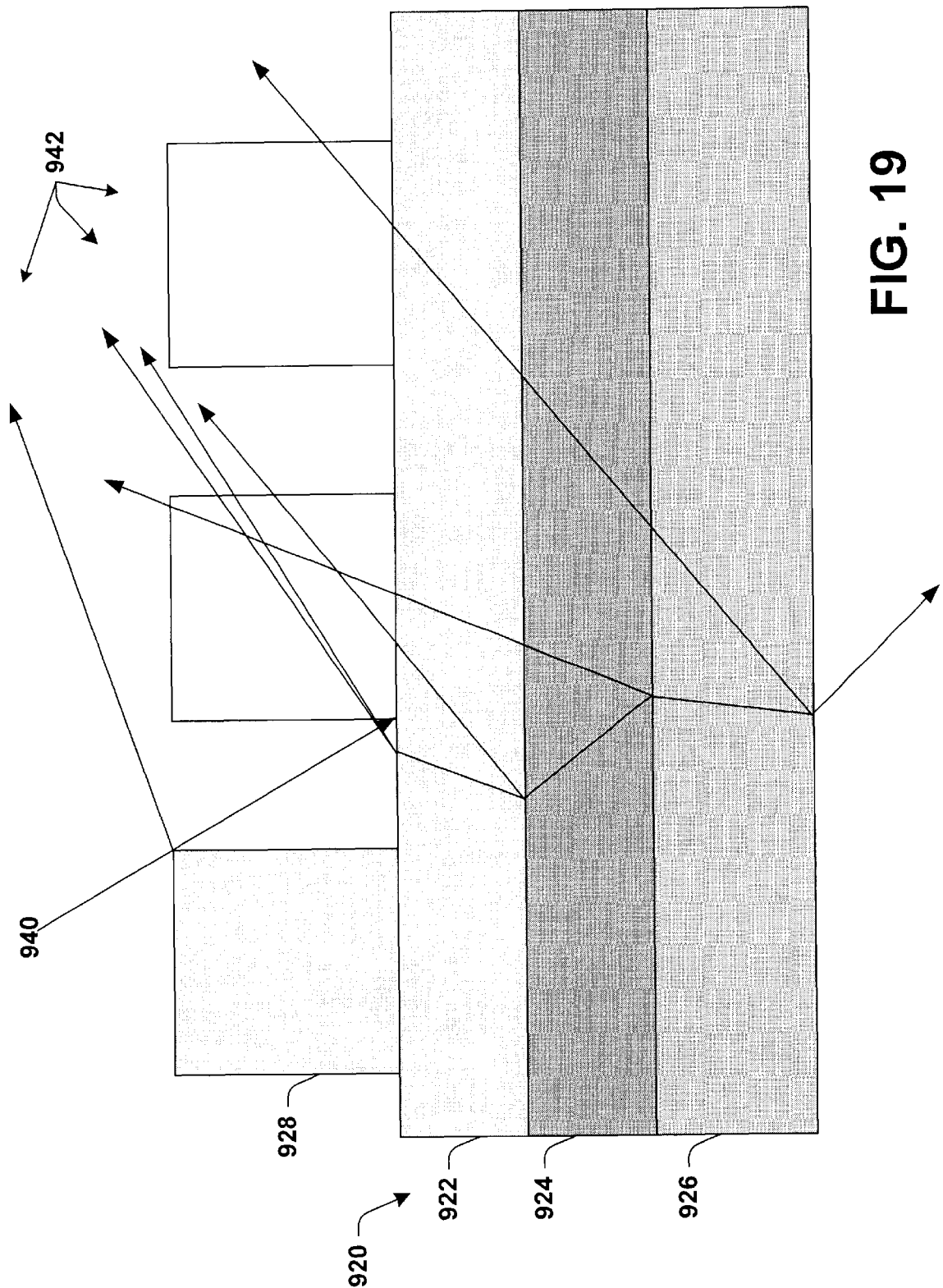
FIG. 19 illustrates a complex reflected and refracted light produced when an incident light is directed onto a surface, in accordance with an aspect of the present invention.

Turning now to FIG. 19, complex reflections and refractions of an incident light 940 are illustrated. The reflection and refraction of the incident light 940 can be affected by factors including, but not limited to, the presence of one or more features 928, and the composition of the substrate 920 upon which the features 928 reside. For example, properties of the substrate 920 including, but not limited to the thickness of a layer 922, the chemical properties of the layer 922, the opacity and/or reflectivity of the layer 922, the thickness of a layer 924, the chemical properties of the layer 924, the opacity and/or reflectivity of the layer 924, the thickness of a layer 926, the chemical properties of the layer 926, and the opacity and/or reflectivity of the layer 926 can affect the reflection and/or refraction of the incident light 940. Thus, a complex reflected and/or refracted light 942 may result from the incident light 940 interacting with the features 928, and/or the layers 922, 924 and 926. Although three layers 922, 924 and 926 are illustrated in FIG. 19, it is to be appreciated by one skilled in the art that a substrate can be formed of a greater or lesser number of such layers.

Figure 20:
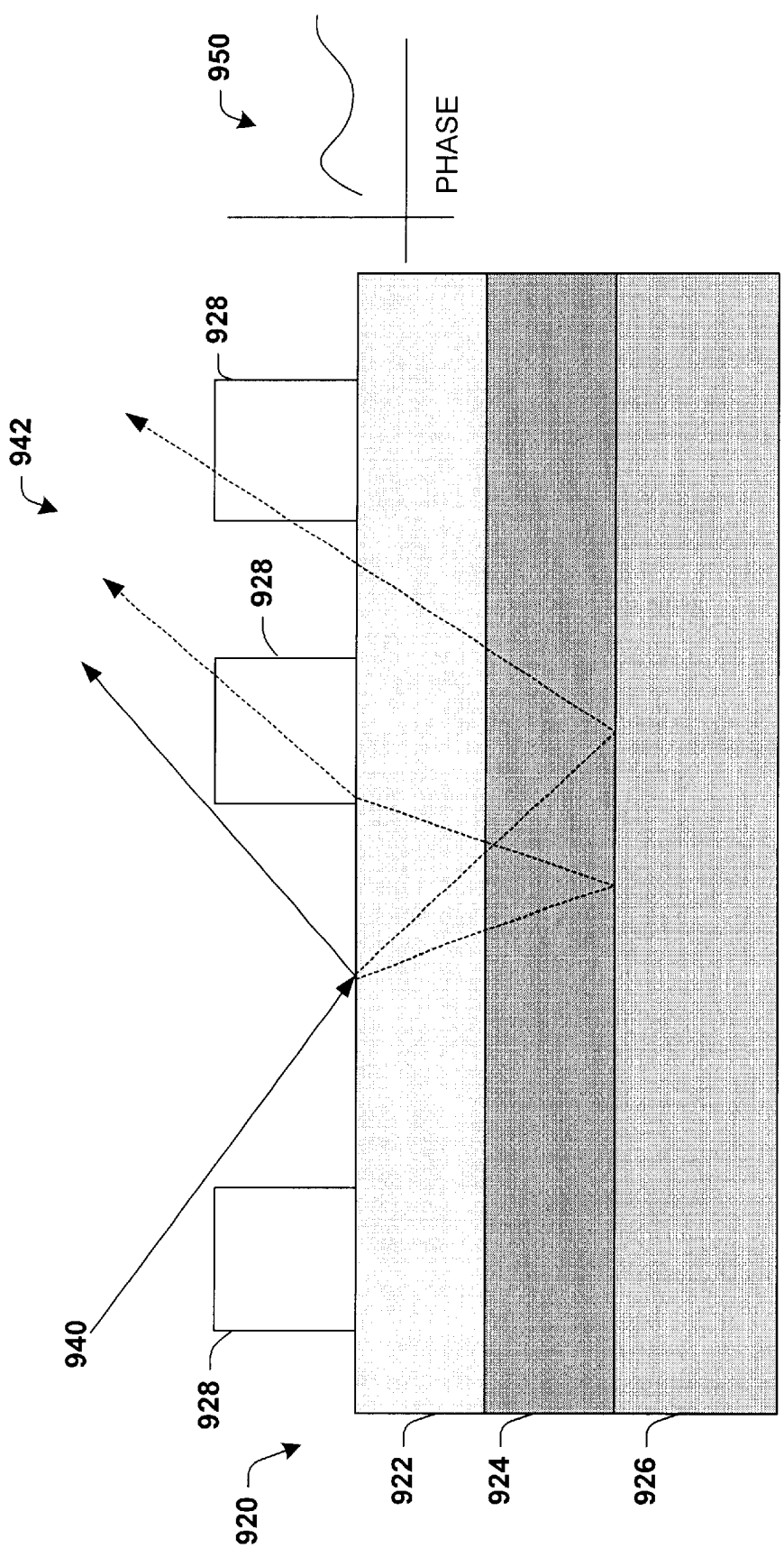
FIG. 20 illustrates a complex reflected and refracted light produced when an incident light is directed onto a surface, in accordance with an aspect of the present invention.
Figure 21:
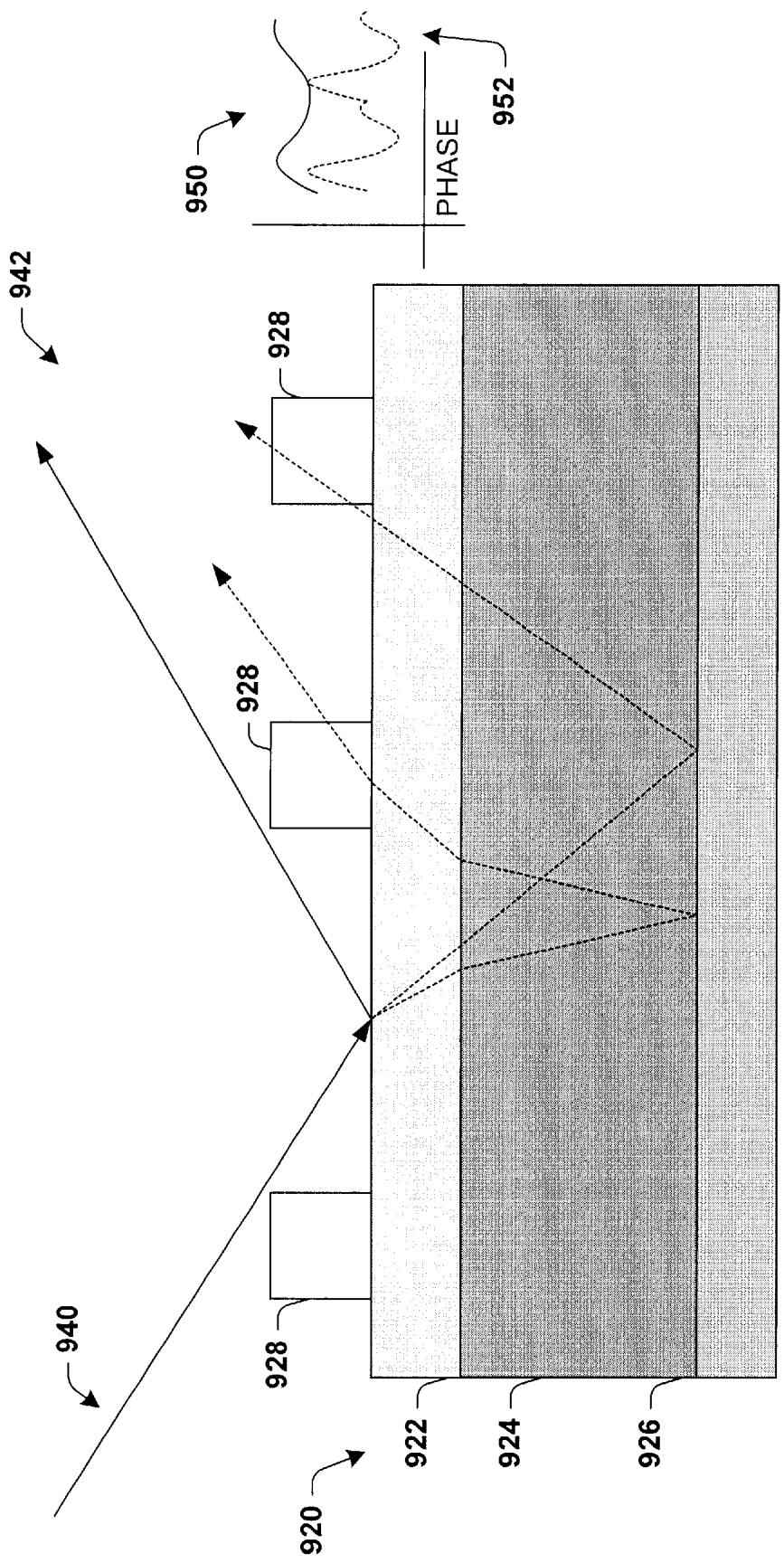
FIG. 21 illustrates a complex reflected and refracted light produced when an incident light is directed onto a surface, in accordance with an aspect of the present invention.

Turning now to FIG. 20, one of the properties from FIG. 19 is illustrated in greater detail. The substrate 920 can be formed of one or more layers 922, 924 and 926. The phase 950 of the reflected and/or refracted light 942 can depend, at least in part, on the thickness of a layer, for example, the layer 924. Thus, in FIG. 21, the phase 952 of the reflected light 942 differs from the phase 950 due, at least in part, to the different thickness of the layer 924 in FIG. 21.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

Described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claim.

What is claimed is:

1. A system for monitoring and controlling the etching of apertures in a complimentary phase shift mask, comprising:

one or more etching components operative to etch one or more apertures in one or more portions of the mask;

an etching component driving system operably connected to the one or more etching components, the etching component driving system operable to drive the one or more etching components;

a system for directing light on to at least one of the one or more apertures;

a measuring system for measuring aperture parameters based on a light reflected from the one or more apertures, the measuring system further including a scatterometry system for processing the light reflected from the one or more apertures; and a processor operatively coupled to the measuring system and the etching component driving system, the processor receiving aperture data from the measuring system and the processor using the data to at least partially base control of the one or more etching components so as to regulate the etching of the one or more apertures, and the processor mapping the mask into a plurality of grid blocks, and making a determination of etching conditions at the one or more grid blocks.

2. The system of claim 1, wherein the processor determines the existence of an unacceptable etching condition for one or more apertures based upon a determined aperture signature differing from an acceptable signature.

3. The system of claim 2, wherein the processor controls the one or more etching components to regulate etching the one or more apertures on the mask.

4. A method for monitoring and controlling aperture etching in a complimentary phase shift mask, comprising:

etching one or more apertures on the complimentary phase shift mask;

directing light onto at least one of the one or more apertures;

collecting light reflected from the at least one aperture;

employing scatterometry means to analyze the reflected light to determine at least one of the depth, the shape, the location and the width of the at least one aperture;

controlling an etching component to etch one or more apertures in the mask; and using a processor to control the at least one etching component based at least partially on data received from the scatterometry system, the processor mapping the mask into a plurality of grid blocks, and making a determination of etching conditions at the one or more grid blocks.

5. The method of claim 4, further comprising:

employing scatterometry means to analyze the reflected light to determine one or more etching conditions of the at least one aperture.

6. The method of claim 5, further comprising:

using a processor to control the at least one etching component based at least partially on data received from the scatterometry system.

7. A method for monitoring and controlling a process for aperture etching in a complimentary phase shift mask, comprising:

employing a plurality of etching components to etch one or more apertures in the mask;

determining the acceptability of the one or more apertures etched in the mask by using a scatterometry system for processing light reflected from the one or more apertures; and using a processor to coordinate control of the plurality of etching components to etch the one or more apertures in the mask, the processor mapping the mask into a plurality of grid blocks, and making a determination of etching conditions at the one or more grid blocks.

8. A system for monitoring and controlling a process for etching openings in a complimentary phase shift mask, comprising:

sensing means for sensing at least one of the shape, location, depth and width of one or more apertures on the mask;

etching means for etching one or more apertures on the mask;

controlling means for selectively controlling the etching means, the controlling means basing the control of the etching means at least in part on analysis of data collected by the sensing means; and a processing means for mapping the mask into a plurality of grid blocks, and making a determination of etching conditions at the one or more grid blocks.

* * * * *